US012787420B2

(12) United States Patent
Udrea et al.

(10) Patent No.: US 12,787,420 B2
(45) Date of Patent: Nov. 3, 2026

(54) MANUFACTURING METHODS FOR A POWER SEMICONDUCTOR DEVICE

(71) Applicant: Cambridge GaN Devices Limited, Cambridge (GB)

(72) Inventors: Florin Udrea, Cambridgeshire (GB); Loizos Efthymiou, Cambridgeshire (GB); Ragini Jain, Cambridgeshire (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 584 days.

(21) Appl. No.: 18/324,624

(22) Filed: May 26, 2023

(65) Prior Publication Data

US 2024/0395632 A1 Nov. 28, 2024

(51) Int. Cl.
*H10D 84/08* (2025.01)
*H10D 88/00* (2026.01)

(52) U.S. Cl.
CPC ............. *H10D 84/08* (2025.01); *H10D 88/00* (2025.01)

(58) Field of Classification Search
CPC ....... H10D 84/08; H10D 88/00; H10D 84/811
USPC .......................................................... 438/172
See application file for complete search history.

(56) References Cited

U.S. PATENT DOCUMENTS 8,390,091 B2 3/2013 Renaud
11,495,678 B2 * 11/2022 Harada ................ H10D 62/106
2009/0302424 A1 * 12/2009 Duskin .................... H10D 8/00 438/380
2010/0025693 A1 * 2/2010 Malhan .................... H10D 8/01 257/E29.002
2021/0104623 A1 4/2021 Sriram
2021/0167199 A1 6/2021 Sriram
2022/0344500 A1 10/2022 Sriram

OTHER PUBLICATIONS

Lyu, et al., "GaN on Engineered Bulk Silicon Power Integration Platform With Avalanche Capability Enabled by Built-in Si PN Junctions", IEEE Electron Device Letters (2022) vol. 43, No. 11, pp. 1826-1829.

(Continued)

*Primary Examiner* — Monica D Harrison
(74) *Attorney, Agent, or Firm* — Renner, Otto, Boisselle & Sklar, LLP

(57) ABSTRACT

A method of making a power device, the method comprising forming a substrate layer, wherein the substrate layer comprises a doped semiconductor material; forming a drift region of a high voltage diode in the substrate layer; forming a wide-bandgap semiconductor transistor over, and in physical contact with, a first section of a first surface of the substrate layer, wherein the first section includes at least part of the drift region of the high voltage diode; forming a first terminal over a second section of the first surface of the substrate layer; forming a second terminal over either: (i) a second surface of the substrate layer, wherein the second surface is opposite the first surface; or (ii) a third section of the first surface of the substrate layer; wherein the method comprises forming the drift region and the first and the second terminal such that a high voltage diode is formed in the substrate layer, wherein at least part of the diode is located below at least part of the wide-bandgap semiconductor transistor.

18 Claims, 19 Drawing Sheets

(56) References Cited

OTHER PUBLICATIONS

Kaminski, et al., "SiC and GaN devices—wide bandgap is not all the same" IET Circuits, Devices & Systems, (2014) vol. 8, issue 3, pp. 227-236 doi:10.1049/iet-cds.2013.0223.

Hult, "Design, Fabrication and Characterization of GaN HEMTs for Power Switching Applications" Thesis for the Degree of Licentiate of Engineering, (2022), Chalmers University of Technology, Department of Microtechnology and Nanoscience—MC2, Microwave Electronics Laboratory, 80 pages ISSN 1652-0769.

Lyu, et al., "GaN on Engineered Bulk Si (GaN-on-EBUS) Substrate for Monolithic Integration of High-/Low-Side Switches in Bridge Circuits", IEEE Transactions on Electron Devies (2022) vol. 69, No. 8, pp. 4162-4169.

Lyu, et al., "A GaN Power Integration Platform Based on Engineered Bulk Si Substrate with Eliminated Crosstalk between High-Side and Low-Side HEMTs", IEEE Electron Device Meeting (2021) vol. 5.2, pp. 1-5 doi: 10.1109/IEDM19574.2021.9720505.

Lyu, et al., "Substrate and Trench Design for GaN-on-EBUS Power IC Platform", IEEE Transactions on Electron Devies (2022) vol. 69, No. 7, pp. 3641-3647.

* cited by examiner

200b

207

Form a III-nitride nucleation layer on the Substrate layer

↓

208

Form a III-nitride channel layer on the nucleation layer

↓

209

Form a III-nitride barrier layer on the channel region

↓

210

Configure a source contact and a drain contact such that an electric current flows between the source contac and a drain contact via a two-dimensional electron gas (2DEG) induced at a heterojunction interface between the channel layer and the barrier layer when the gate is biased at an appropriate level. This combination of features may be referred to as a HEMT

Figure 5

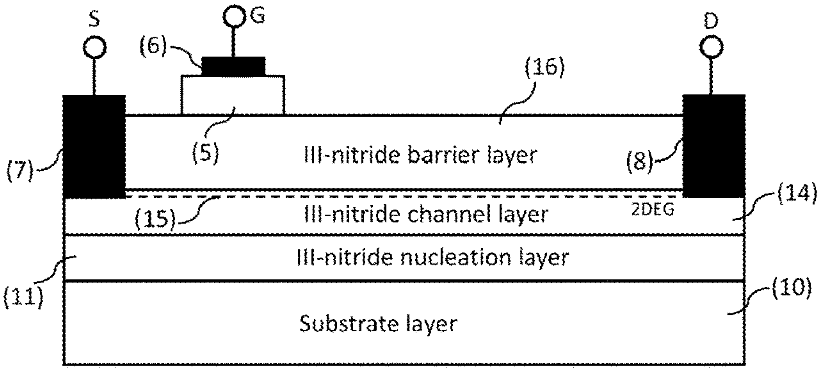

Figure 6

MANUFACTURING METHODS FOR A POWER SEMICONDUCTOR DEVICE

FIELD OF THE DISCLOSURE

The present disclosure relates to semiconductor devices. Particularly, but not exclusively, the disclosure relates to hetero-structure AlGaN/GaN high electron mobility transistors or rectifiers.

BACKGROUND OF THE DISCLOSURE

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems.

Additionally, GaN with its wide bandgap offers the potential for emitting light at higher frequencies for example the green, blue, violet, and ultraviolet portions of the electromagnetic spectrum.

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility (μ=2000 cm2/(Vs)) values. In addition, the piezopolarization charge present at the AlGaN/GaN heterostructure, results in a high electron density in the 2DEG layer (e.g. 1×1013 cm−2). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). Where specific Rds(ON) is often the product of the resistance of a device times the area of the device on wafer. An extensive amount of research has focused on the development of power devices using AlGaN/GaN heterostructures.

Layers which constitute the AlGaN/GaN heterojunction transistor are often epitaxially grown on a substrate from a different material for example Silicon, Silicon Carbide or Sapphire. Epitaxial growth of GaN on different substrates has advantages and disadvantages both in terms of the difficulty and cost of growing high quality layers and in terms of device performance. A non-exhaustive list of things to consider when choosing a suitable substrate is: substrate lattice constant mismatch with GaN, substrate thermal expansion coefficient mismatch with GaN, substrate cost, substrate thermal conductivity etc.

Silicon is a popular option due to the low cost and availability of Silicon substrates. Use of Silicon as a substrate however comes with some disadvantages. Silicon and GaN have a large lattice constant mismatch and a large thermal coefficient mismatch. A transition layer is used to facilitate the growth of high quality GaN epitaxial layers on Silicon. A transition layer often comprises graded AlN/AlGaN layers or a superlattice. A GaN buffer layer is grown on the transition layer. The GaN buffer layer is often carbon doped to limit vertical leakage from the surface high voltage terminal e.g. drain and the substrate backend contact. An unintentionally doped GaN layer is then grown where the two dimensional electron gas at the interface with an AlGaN barrier layer is present.

Silicon Carbide (SiC) has excellent thermal conductivity (almost three times that of silicon), and therefore GaN-on-SiC is an option which is receiving increasing interest for high power applications. SiC, is also a wide bandgap material which is used to develop power devices. The critical electric field of SiC is comparable to GaN (3.5 MV/cm and 3.3 MV/cm, respectively) and therefore it can also sustain higher voltages in smaller dimensions compared to Silicon. Additionally, SiC has a smaller lattice constant mismatch with GaN compared to Silicon with GaN. Therefore, the growth of epitaxial layers of GaN-on-SiC is less challenging compared to the growth of epitaxial layers of GaN-on-Silicon. GaN-on-Silicon epitaxial growth often comprises a transition layer to manage the stress, warping etc. and achieve high quality material. In GaN-on-SiC, only a thinner AlN nucleation layer is required.

The SiC substrate used in GaN-on-SiC devices may be a monocrystalline 4H-SiC, 6H-SiC or 3C-SiC substrate. The substrate may be doped to be conductive or may be semi-insulating. 4H-SiC is the most commonly available polytype.

Whether the substrate is Si or SiC, in a lateral heterojunction transistor the off-state potential is often sustained both laterally and vertically. Laterally, refers to the dimension between the gate and drain terminal, where gate and drain contacts are both placed on the surface of the wafer. Vertically, refers to the dimension between the drain and substrate contact. The backside of the wafer is often connected to the source potential, often at package level.

The substrate in a GaN device is generally not electrically utilised i.e. it is not used to conduct any current in the normal operation of the device. Additionally, the substrate does not sustain a significant voltage drop across it during the off-state operation of the device. The entire substrate acts as a field plate, virtually taking the substrate potential which is often grounded. In that sense, the substrate may be described as offering a mechanical and thermal function but not necessarily an electrical function in the operation of the device.

As a result, in existing devices the majority or even the entirety of the vertical potential drop is observed in the III-nitride epitaxial layers.

Where a semi-insulating SiC substrate is used, the substrate does have a voltage drop across it. This allows the development of device with thinner GaN-based layers. However, semi-insulating SiC substrates are more expensive and less common than conductive SiC substrates (whether n-doped or p-doped). In addition, the semi-insulating substrate is used in a similar manner to a dielectric material and therefore does not feature or does not behave as an active semiconductor device such as a diode or transistor. There are advantages in using diode or transistors incorporated in the substrate as described as part of this disclosure.

When a monocrystalline doped SiC substrate is used, and it is connected to source potential, the potential drop during the blocking/off-state mode of operation of the HEMT is sustained almost entirely in the III-nitride epitaxial layers and in particular a GaN buffer layer. If vertical breakdown is the limiting factor, in order to increase the vertical breakdown of a device, the thickness of the GaN buffer layer is often increased which increases the cost and complexity of epitaxial growth. This also applies to GaN-on-Si devices.

An additional challenge in GaN HEMT is their lack of avalanche capability. Avalanche capability may be beneficial in a power device as it limits the maximum potential that can develop between the high voltage and low voltage terminals of a device, and therefore can limit the maximum electric field in the structure. This may provide reliability advantages, in terms of device lifetime as over-voltages in operation are limited. Because of the lack of avalanche capability, GaN HEMT can often be over engineered in terms of the actual breakdown being much higher than the rated breakdown. This is done by having larger dimensions (e.g. lateral distance between gate and drain and increased thickness of the GaN stack).

Finally, while GaN HEMTs have efficient forward conduction (drain biased positively with respect to source and the gate voltage above the threshold voltage) with low on-state losses, the reverse conduction (when the source and gate potentials are the same and the source is positively biased with respect to the drain) is relatively poor, with significant steady-state losses due to a large drop between the source and drain terminal for a given current level.

US2021/0104623 A1 describes a device including a source electrically coupled to a group III-nitride barrier layer; a gate electrically coupled to the group III-nitride barrier layer; a drain electrically coupled to the group III-nitride barrier layer; and a p-region being in the substrate or on the substrate below the group III-nitride barrier layer.

US2021/0167199 A1 describes an apparatus to address gate lag effect and/or other negative performance with a p-region that extends toward a source side of a substrate and towards a drain side of the substrate.

US2022/0344500 A1 describes a high-electron mobility transistor includes a substrate layer, a first buffer layer provided on the substrate layer, a barrier layer provided on the first buffer layer, a source provided on the barrier layer, a drain provided on the barrier layer, and a gate provided on the barrier layer.

U.S. Pat. No. 8,390,091 B2 describes a structure that includes a vertical Schottky diode, including an anode; a cathode including the substrate, and a Schottky barrier between the cathode and the anode, the Schottky barrier being situated between the substrate and an anode layer in a stack of layers.

SiC and GaN devices—wide bandgap is not all the same (Kaminski et al), IET Circuits Devices & Systems, 2014, Vol. 8, Iss. 3, pp. 227-236, contains discussions regarding the use of various materials in semiconductor devices.

Design, Fabrication and Characterization of GaN HEMTs for Power Switching Applications (Björn Hult), Microwave Electronics Laboratory, Department of Microtechnology and Nanoscience, Chalmers University of Technology, 2022, contains discussions of AlGaN/GaN-on-SiC high voltage metal-insulator semiconductor (MIS) HEMTs fabricated on 'buffer-free' heterostructures.

SUMMARY

It is an object of this invention to provide a method of forming a wide bandgap transistor on a substrate which features an active high voltage diode. The resulting structure May provide an efficient design leading to a better trade-off between on-state and breakdown, potentially offering avalanche capability as well as an efficient reverse conduction path leading to lower losses during reverse conduction. Part of the diode is placed directly under part of the wide bandgap transistor and is configured to support a substantial fraction of the voltage between the terminals of the power device.

The combination of the wide bandgap transistor and substrate diode may be referred to as a single power device.

The wide bandgap transistor may be formed in a wide bandgap semiconductor.

By wide bandgap, we mean semiconductors with a bandgap of at least 2 eV. Examples of suitable wide bandgap materials include, non-exhaustively, GaN, AlGaN, AlN, GaO, SiC, Diamond, etc.

The wide bandgap transistor may preferably comprise a lateral heterojunction transistor such as a HEMT and the wide bandgap semiconductor may preferably be based on III-Nitride. The wide bandgap semiconductor may comprise a heterojunction between GaN and AlGaN. The substrate may be formed of wide bandgap semiconductor material or low bandgap material such as silicon carbide (SiC such as 4H SiC, 6H SiC or 3C SiC) or Silicon, respectively.

Alternatively, the wide bandgap semiconductor may be made of GaO, AlN, AlGaN and the transistor may be a MOFSET, MESFET, deep depletion FET etc. Alternatively, the semiconductor substrate may be made of GaN, AlN, Diamond.

According to a first aspect of the invention, there is provided a method of making a power device, the method comprising:

- forming a substrate layer, wherein the substrate layer comprises a doped semiconductor material;
- forming a drift region of a high voltage diode in the substrate layer;
- forming a wide-bandgap semiconductor transistor over, and in physical contact with, a first section of a first surface of the substrate layer, wherein the first section includes at least part of the drift region of the high voltage diode;
- forming a first terminal over a second section of the first surface of the substrate layer;
- forming a second terminal over either:
  - (i) a second surface of the substrate layer, wherein the second surface is opposite the first surface; or
  - (ii) a third section of the first surface of the substrate layer;
- wherein the method comprises forming the drift region and the first and the second terminal such that a high voltage diode is formed in the substrate layer, wherein at least part of the diode is located below at least part of the wide-bandgap semiconductor transistor.

In the following descriptions examples of this invention are restricted to a HEMT based on a AlGaN/GaN heterojunction and SiC or Si substrate for improved clarity and readability. However, it will be understood that the invention is more widely applicable to other wide and non-wide bandgap materials as described above.

According to the present disclosure, a method of fabricating a AlGaN/GaN heterojunction device on a SiC/Si substrate is proposed, with a diode in the substrate. The heterojunction transistor can be a HEMT. The HEMT can achieve a more effective potential distribution during the blocking mode (OFF-state bias) or during transients (from low voltages to high voltages or opposite) through a more effective use of the substrate, compared to existing AlGaN/GaN HEMTs. More effective use means that the substrate may be electrically utilised as a high voltage region, by seeing a substantial part of the potential drop between the device drain terminal and the device substrate terminal in the device off-state. This may be achieved through a diode based on a high voltage junction in the substrate layer.

The junction may be part of a p-n diode. Alternatively, a diode based on a p-i-n or p+/p−/n+ or p+/n−/n+ junction, a diode based on a Superjunction or a Schottky diode may be used. Bipolar diodes such as p-n or P-I-N or p+/p−/n+ or n+/p−/p+ junction have lower leakage current and require ohmic metallization. Schottky diodes have relatively higher leakage currents and require at least one non-ohmic, Schottky contact with either the anode or cathode terminal. The Schottky diodes may however feature unipolar conduction in the on-state and this results in very fast switching (generally associated with zero reverse recovery losses if the diode is used in anti-parallel configuration with the HEMT). Combinations of bipolar/Schottky diodes such as Junction Barrier diodes or Merged Schottky-bipolar diodes (also known as Merged p-n Schottky diodes) can also be used.

The incorporation of a diode under at least part of the HEMT device may lead to a design with an improved specific ON-state resistance, as the dimension of the GaN HEMT do not need to be over engineered.

Moreover, the effective use of the substrate as a region can allow substantially thinner GaN-based layers (such as GaN buffer layer or no GaN buffer layer at all). This is advantageous both from a cost perspective and reduced process complexity perspective. Furthermore, since the voltage is laterally distributed within the heterojunction transistor with little or virtually no vertical component, there is less risk of traps being ionized in the GaN buffer which could create reliability issues such as Dynamic Ron increase.

Due to increasing OFF-state bias voltage, impact ionization in the depletion region of the reverse biased diode in the substrate will lead to avalanche breakdown. The reverse biased diode in the substrate may be designed to reach avalanche breakdown before other modes of breakdown in the HEMT (such as soft breakdown due to leakage currents, or static or time-dependent dielectric breakdown) occur in the nitride epitaxial layers or the passivation/dielectric layers in the device, or vertically between the surface terminals and the substrate terminal. Having avalanche capability is highly desirable in some power electronics application. This is because if the surge energy of the device is not exceeded, then an avalanche breakdown is recoverable. On the other hand, other modes of breakdown which may occur in a conventional GaN HEMT, such as dielectric breakdown, are not recoverable.

Depending on the substrate used, the diode in the substrate under the HEMT can also be used in anti-parallel configuration with the GaN HEMT. This may be more suitable in the example where a SiC substrate is used. If a p+/p−/n+ or p+/n−/n+ diodes are used the anode terminal of the diode can be connected to the drain terminal of the HEMT while the cathode terminal of the diode can be connected to the source terminal of the HEMT. If a p+/p−/n+ diode is used the anode terminal may be preferably connected to the backside of the SiC substrate (as the substrate terminal). If a p+/n−/n+ diode is used the cathode terminal for the p+/n−/n+ diode may be preferably connected on the backside of the substrate as the substrate terminal. In either of the two cases mentioned, the SiC diode can be used therefore in a forward-biased mode when the HEMT is in a reverse conduction state. In this configuration, the common source terminal is more positively biased than the drain terminal. In this condition, the SiC diode is forward biased and provides a parallel conduction path to that existing between the source and drain terminals of the HEMT (through the 2DEG layer). The SiC diode can be more effective (offering lower on-state voltage drop or lower equivalent on-state resistance) in the forward-biased mode than the parallel 2DEG channel in a reverse conduction mode thus minimising the on-state losses in this mode of operation. The SiC diode can also take a surge of current. If needed, during this mode of operation. If the SiC diode is largely unipolar and based on a Schottky barrier, then it produces negligible extra charge during reverse conduction and can be very fast during switching leading to very little (negligible) reverse recovery losses.

Furthermore, the parasitic input and output capacitances in the GaN HEMT limit the losses during the transient signals (in particular the turn-on process). By providing a depletion region in the substrate diode under the GaN HEMT, the capacitances (in particular the output capacitance) can be minimised. The large body of the depletion region in the substrate present at higher voltages in the drift region, when the substrate diode is reverse biased directly under the III-nitride semiconductor region leads to a small capacitance, minimising the switching losses and switching time.

Thus, the method of making a power device is provided may comprise:

- forming a first semiconductor substrate layer doped with at least a first conductivity type;
- forming a wide-bandgap semiconductor transistor over a first section of the surface of the substrate layer;
- forming a first terminal on a second section of the surface of the substrate layer;
- forming a second terminal on the backside/an opposite side of the substrate layer or a third section of the surface of the substrate layer;
- configuring the first and the second terminal such that a diode is formed in the substrate, wherein an electric current flows between the second terminal and the first terminal when the terminals are biased at an appropriate level forming a diode in the substrate layer; and
- wherein at least part of the diode is directly located under and is in physical contact with at least part of the wide-bandgap semiconductor transistor.

In one example, the wide-bandgap transistor may be a gallium nitride high electron mobility transistor (GaN HEMT).

In a further example, the GaN HEMT may comprise one or multiple heterojunctions with one or multiple active 2DEG channels, and/or the method may comprise forming multiple GaN HEMTs or other transistors on the substrate. "Active channels" herein refer to the channels that, during ON-state operations of the HEMTs, the current flows through.

Additionally, or alternatively, the method may comprise forming a second heterojunction transistor, for example a second GaN HEMT, over the substrate layer. The second heterojunction transistor may be formed via the same or a different method as the first heterojunction transistor. Further (e.g. third, fourth, etc.) transistors may also be formed. The first and second heterojunction transistors may be connected in a half bridge.

For example, the method may comprise forming a second wide-bandgap semiconductor transistor over the first surface of the substrate layer. Optionally, the wide-bandgap semiconductor transistor and the second wide-bandgap semiconductor transistor may each be high electron mobility transistors (HEMTs). The HEMTs may be connected in a half bridge. In this case, the diode may be a common diode for the HEMTs, or the method may comprise forming a second diode associated with the second wide bandgap transistor. The second diode may be formed in a similar manner to the first diode. For example, at least part of the second diode may located below at least part of the second wide-bandgap semiconductor transistor, the second diode comprising a third terminal and a fourth terminal, the third and the fourth terminal different to the first and second terminals.

In one example, forming a wide-bandgap semiconductor transistor over a first section of the surface of the substrate layer may comprise:

Forming a III-nitride nucleation layer on the Substrate layer;

Forming a III-nitride transition layer on the nucleation layer;

Forming a III-nitride buffer layer on the transition layer;

Forming a III-nitride channel layer on the buffer layer;

Forming a III-nitride barrier layer on the channel region; and

Configuring a source contact and a drain contact such that an electric current flows between the source contact and a drain contact when the gate, drain and source terminals are biased at an appropriate level, via a two-dimensional electron gas (2DEG) induced at a hetero-junction interface between the channel layer and the barrier layer.

This example of a method of forming a wide bandgap transistor may be more suitable for an AlGaN/GaN HEMT formed on a Silicon substrate or other non-wide bandgap substrate material.

In another example, the method of forming a wide-bandgap transistor may comprise:

Forming a III-nitride nucleation layer on the Substrate layer;

Forming a III-nitride channel layer on the buffer layer;

Forming a III-nitride barrier layer on the channel region; and

Configuring a source contact and a drain contact such that an electric current flows between the source contact and a drain contact when the gate, drain and source terminals are biased at an appropriate level, via a two-dimensional electron gas (2DEG) induced at a hetero-junction interface between the channel layer and the barrier layer.

This example of a method of forming a wide bandgap transistor may be more suitable for an AlGaN/GaN HEMT formed on a SiC substrate or other wide bandgap substrate material.

In one example, forming a first semiconductor substrate layer doped with at least a first conductivity type may comprise forming a single substrate region which is either p+ doped or n+ doped. The first semiconductor substrate layer may act as an p+ anode layer where an anode contact is formed or may act as a n+ cathode layer where a cathode contact is formed. Alternatively, the single region of the substrate layer may be p− doped or n− doped.

In another example, an additional region doped with a first conductivity type may be formed in the substrate. The additional region may have a low doping concentration (e.g. p− or n−) and may act as a drift region for the high voltage diode associated with the substrate layer. The drift region may be at least partly in physical contact with the III-nitride layers where a GaN HEMT is formed as described in examples above.

The drift region may be formed through diffusion of dopants. Alternatively, it may be formed through an implantation of dopants followed by diffusion.

In another example, an additional substrate region (i.e. second region) doped with a second conductivity type may be formed near the surface of the substrate wafer. The second region may have a higher doping concentration (e.g. n+ or p+) than the drift region. The second region may act as an p+ anode layer where an anode contact is formed or may act as a n+ cathode layer where a cathode contact is formed. This may result in the formation of a vertical p+/p−/n+ or p+/n−/n+ diode, e.g. when a second terminal of the substrate diode is formed on the backside of the wafer (also referred to herein as the opposite side of the substrate layer).

In another example, an additional substrate region (i.e. third region) doped with a first conductivity type of doping may be formed near the surface of the substrate wafer. The third region may have a higher doping concentration (e.g. p+ or n+) than the drift region. The third region may act as an p+ anode layer where an anode contact is formed or may act as a n+ cathode layer where a cathode contact is formed. This may result in the formation of a lateral p+/p−/n+ or p+/n−/n+ diode, e.g. if the first and second terminals of the substrate diode are formed on the surface of the substrate.

In another example, a superjunction region may be formed in the substrate layer. The superjunction may comprise regions of alternating n and p layers, and may act as the drift region for the high voltage diode associated with the substrate layer. The superjunction may comprise a single n+ layer and a single p+ layer, or multiple such layers interleaved with one another. When the superjunction is used as a drift region in a high voltage diode, the n and p layers deplete at high reverse voltages applied between the anode and cathode terminals. The superjunction structure is configured for charge compensation between the n and p layers to provide more uniform electric field and potential distribution during reverse bias.

The layers of the superjunction may be formed such that they alternate vertically or laterally. Laterally herein describes the dimension of separation between the source and drain terminals of the transistor, while vertically (or longitudinally) may describe a perpendicular dimension in which e.g. the gate terminal and substrate are separated.

Part (or the entirety) of the superjunction drift region is physically arranged directly under the active III-Nitride semiconductor regions where the GaN HEMT is formed. The superjunction drift region may be in physical contact with the III-Nitride semiconductor regions where the GaN HEMT is formed.

In one example, the formation of the first terminal of the substrate diode may comprise:

a recess (e.g. by an etching process step such as deep reactive ion etching (DRIE)) in the III-nitride layers reaching the surface of the substrate layer; and forming a Schottky contact on the drift region in the recess.

In another example, an ohmic contact may be formed in the recess. In the case where a high doping region (e.g. aforementioned second region) was formed near the surface of the substrate layer, the ohmic contact may be formed on the high doping region. In this case, the alignment of the recess region with the high doping region may be required.

For example, metal contacts may be formed with known processes such as physical vapour deposition (PVD), e-beam PVD, sputtering etc.

In the case where a high doping region was not formed before the growth and recess of the III-nitride layers, a high doping region may be formed after the recess is made (e.g. through implantation of dopants) for a good ohmic contact.

The implantation may be self-aligned to the recess region or via a passivation step following the recess.

Following implantation of dopants, a diffusion period may be used.

The formation of the second terminal of the substrate diode may comprise a similar method to any of the examples given for the formation of the first terminal if the second terminal is also formed on the surface of the substrate layer.

In another example, the second terminal of the substrate diode may be formed on the back of the substrate as a back-metallisation contact. A Schottky or ohmic contact may be formed. The contact may be formed for example by physical vapour deposition (PVD) or sintering.

According to a second aspect of the invention, there is provided a method of making a power device comprising:

- forming a doped semiconductor substrate layer;
- forming a first doped region with a high concentration of a first conductivity type of doping (e.g. p+) in the substrate layer;
- forming a drift region of a high voltage diode in the substrate layer;
- forming a second doped region with a high concentration of a second conductivity type of doping (e.g. n+) in the substrate layer;
- forming a wide-bandgap semiconductor transistor over the substrate layer, at least a part of the second doped region extending beyond an edge of the wide bandgap semiconductor transistor;
- forming a first terminal on the second doped region of the substrate layer;
- forming a second terminal on an opposite side of the substrate layer to the first terminal, or on a same side of the substrate layer as the first terminal but laterally separated from the first terminal;
- wherein the method comprises forming the drift region and the first and the second terminal such that a high voltage diode is formed in the substrate layer, wherein at least part of the diode is located below at least part of the wide-bandgap semiconductor transistor.

According to a third aspect of the invention, there is provided a method of making a power device comprising:

- forming a doped semiconductor substrate layer;
- forming a first doped region with a high concentration of a first conductivity type of doping (e.g. p+) in the substrate layer;
- forming a drift region of a high voltage diode in the substrate layer;
- forming a second doped region with a high concentration of a second conductivity type of doping (e.g. n+) in the substrate layer;
- forming a wide-bandgap semiconductor transistor over the substrate layer;
- forming a recess in the transistor, wherein the recess exposes or otherwise reaches the second doped region;
- forming a first terminal on the second doped region of the substrate layer;
- forming a second terminal on an opposite side of the substrate layer to the first terminal, or on a same side of the substrate layer as the first terminal but laterally separated from the first terminal;
- wherein the method comprises forming the drift region and the first and the second terminal such that a high voltage diode is formed in the substrate layer, wherein at least part of the diode is located below at least part of the wide-bandgap semiconductor transistor.

In the second and third aspect of the invention, the formation of the terminals of the wide bandgap transistor may need to be appropriately aligned to the second doped region formed in the substrate layer.

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

FIG. 5 depicts an example process for performing a method step of the method of FIG. 1.

FIG. 6 depicts schematically a structure formed according to the method of FIG. 5.

DETAILED DESCRIPTION OF THE PREFERRED EMBODIMENTS

Figure 1:
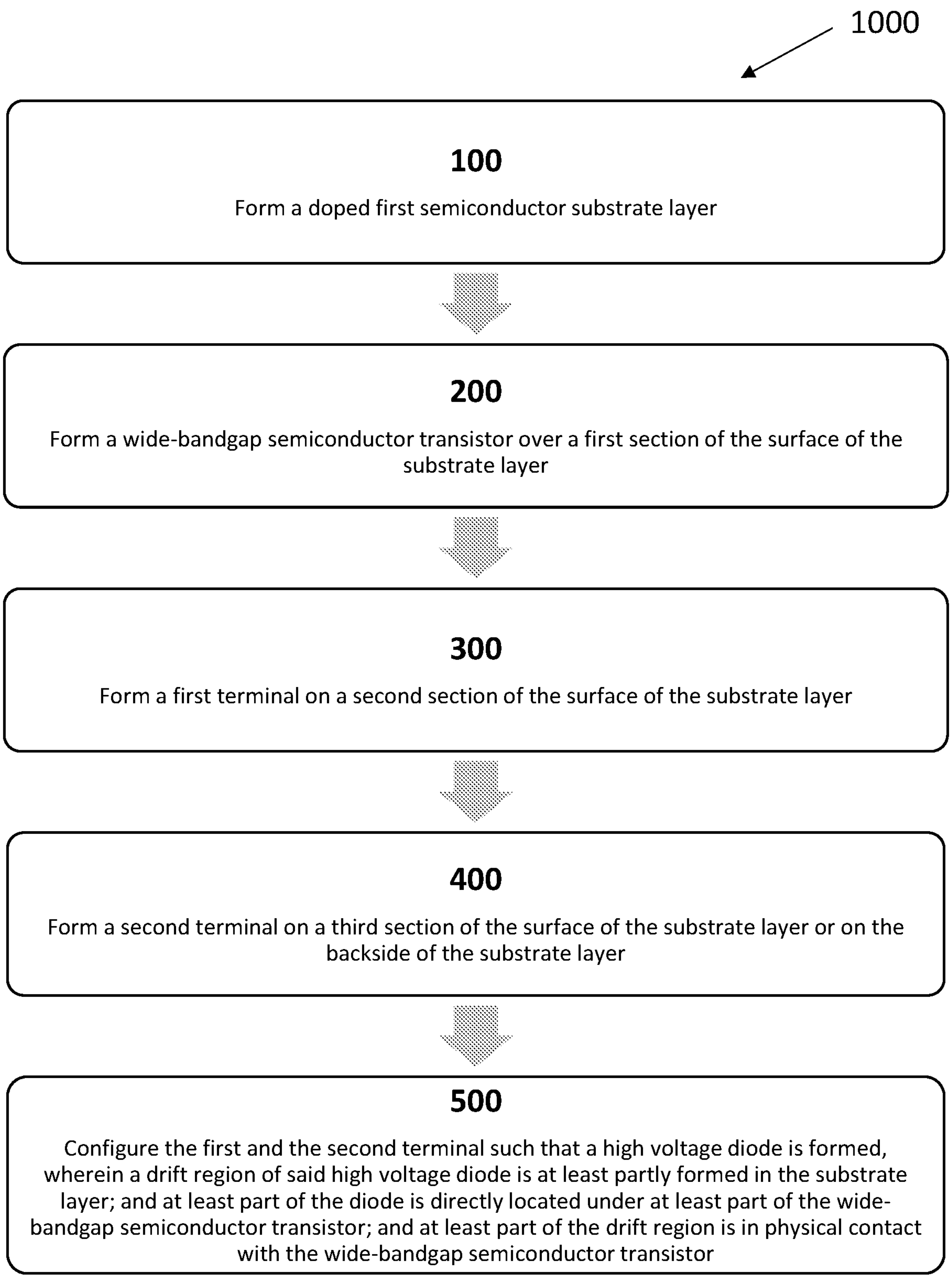
FIG. 1 depicts an example method according to the present disclosure.

Like reference numerals are provided throughout for corresponding features.

FIG. 1 is a flow diagram depicting an example method 1000 of forming a wide bandgap transistor on a substrate layer, wherein the substrate layer comprises a diode which is located under at least part of the wide band-gap semiconductor transistor.

In step 100, a semiconductor substrate layer is formed. The semiconductor substrate layer is formed from at least a first doped semiconductor layer with a first conductivity type.

In step 200, a wide-bandgap semiconductor transistor, such as a GaN HEMT or other suitable transistor, is formed over a first section of the surface of the substrate layer. The transistor may be formed directly over the substrate, or additional layers (such as a transition layer) may be provided between the transistor and the substrate. As used herein, a wide bandgap semiconductor material is a semiconductor material with a bandgap of at least 2 eV. Examples of such wide bandgap semiconductor materials include, non-exhaustively, GaN, AlGaN, AlN, GaO, SiC and Diamond.

In step 300, a first terminal is formed on a second section of the surface of the substrate layer. The second section may be laterally separated from the first section along the surface, adjacent to the first section, overlap with the first section or be within the first section.

In step 400, a second terminal is formed. The second terminal may be formed on a "backside" of the substrate layer (e.g. on a second surface of the substrate that is opposite the "top" surface that is facing the transistor), or may be formed on a section of the "top" surface of the substrate layer. As with the second section, the third section may be laterally separated from the first section along the surface, adjacent to the first section, overlap with the first section or be within the first section.

In step 500, the first and the second terminals are configured such that a high voltage diode is formed, wherein a drift region of said high voltage diode is at least partly formed in the substrate layer; and at least part of the diode is directly located under at least part of the wide-bandgap semiconductor transistor; and at least part of the drift region is in physical contact with the wide-bandgap semiconductor transistor.

An electric current flows between the second terminal and the first terminal (or vice versa) when the terminals are biased at an appropriate level. The first and second terminals are therefore formed such that a diode is formed at least partially within the substrate layer. The first and second terminals are located such that at least part of the diode is located below at least part of the wide-bandgap semiconductor transistor and at least part of the diode is in physical contact with at least part of the active region of the wide-bandgap semiconductor transistor. For example, a drift region of the diode may be below the transistor and in physical contact with at least a part of the transistor.

The drift region participates directly to support both laterally and vertically a high voltage or a fraction of the high voltage between the drain terminal of the heterojunction transistor and the anode terminal of the diode, when the heterojunction is in the blocking mode or during the transient states.

It will be understood that the steps of method 1000 may each be sub-divided in additional smaller methods. Further details regarding each of the steps of method 1000, and their various optional embodiments, are provided below.

Figure 2:
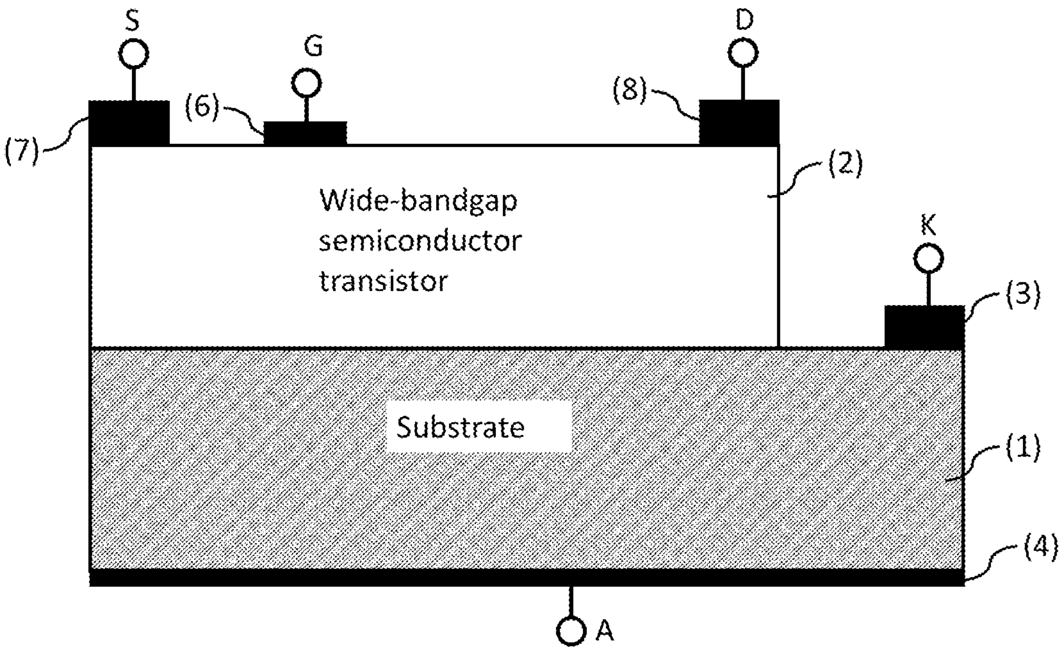
FIG. 2 depicts schematically a structure formed according to the method of FIG. 1.

FIG. 2 illustrates a schematic cross section of one example of a semiconductor transistor structure formed on a substrate according to the method 1000 of FIG. 1. The wide band-gap semiconductor transistor (2) comprises a source terminal (7), gate terminal (6) and drain terminal (8). The diode, in this example, comprises a cathode terminal (3) on the "top" or "upper" surface of the substrate layer (1) and an anode terminal (4) on the "backside" or "bottom" of the substrate layer (1). It will be understood that directional terms such as top, bottom, over, below, etc. are used herein in reference to the illustrated figures, and are merely used to assist in describing the relative positioning of the components of the device. These terms are not intended to be limiting in nature. In another example (not illustrated here), the anode terminal (4) of the diode may also be formed on the upper surface of the substrate layer (1). Alternatively, only the anode terminal (4) may be on the upper surface of the substrate layer (1) and the cathode (3) may be formed on the backside surface of the substrate layer (1). Examples will be illustrated in other figures herein.

Figure 3:
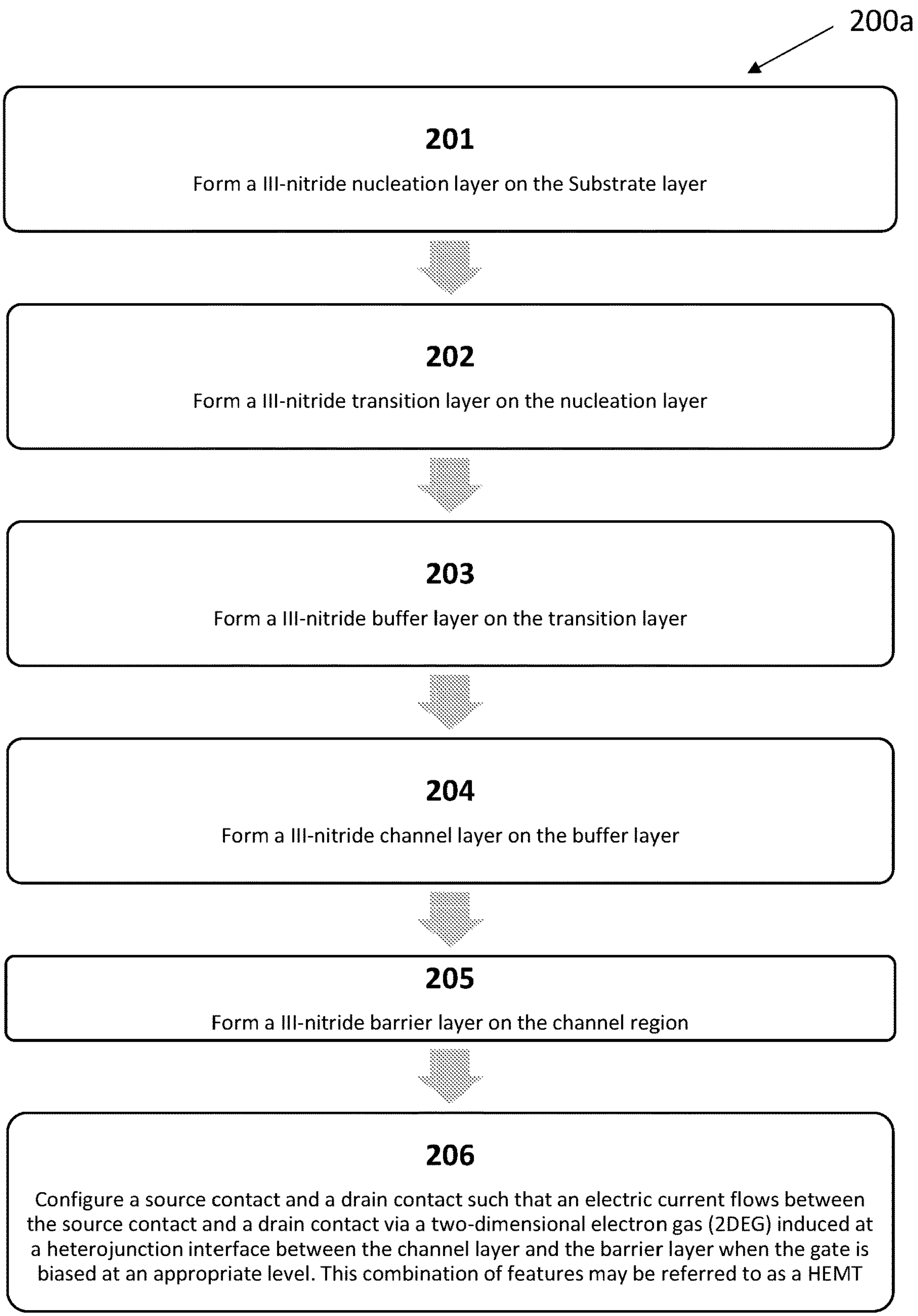
FIG. 3 depicts an example process for performing a method step of the method of FIG. 1.

FIG. 3 depicts a flow diagram of a method 200*a*. Method 200*a* is an example of steps that may be used to form a wide-bandgap semiconductor transistor over a first section of the surface of the substrate layer, as described in method step 200 of method 1000. This method 200*a* may be particularly suitable if e.g. a heterojunction transistor such as an AlGaN/GaN HEMT is formed on a Silicon substrate, or a substrate comprising other suitable non-wide bandgap semiconductor materials.

In a step 201, a III-nitride nucleation layer is formed over the substrate layer.

In a step 202, a transition layer is formed over the nucleation layer.

In a step 203, a III-nitride buffer layer is formed over the transition layer.

In a step 204, a III-nitride channel layer is formed over the buffer layer.

In a step 205, a III-nitride barrier layer is formed over the channel region of the channel layer.

In a step 206, the source terminal and drain terminal of the transistor are configured such that an electric current flows between the source contact and a drain contact via a two-dimensional electron gas (2DEG) induced at a heterojunction interface between the channel layer and the barrier layer when the gate is biased at an appropriate (e.g. threshold) level. The configuration of the source and drain terminals may comprise forming the terminals in a suitable location. This combination of features may therefore form a high electron mobility transistor (HEMT).

Figure 4:
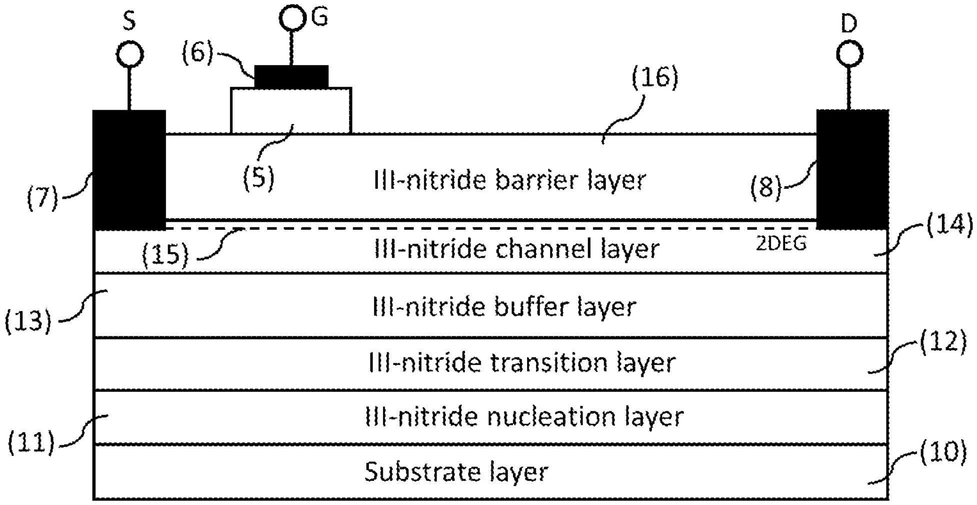
FIG. 4 depicts schematically a structure formed according to the method of FIG. 3.

An example HEMT formed according to the steps of method 200*a* is illustrated in FIG. 4. Epitaxial growth of GaN (AlGaN, AlN) on Silicon may require an AlN nucleation layer (11) to initiate the epitaxial growth. A transition layer (12) may be used due to the large lattice mismatch between GaN and Si. The transition layer (12) may be a graded AlGaN layer or a 'superlattice' structure. A GaN buffer layer (13) may then be formed. The buffer layer may be Carbon doped to reduce vertical leakage in the structure. A GaN channel layer (14) may then be formed. The GaN channel layer may be unintentionally doped (UID). An AlGaN barrier layer (16) may then be formed. Due to the spontaneous and piezoelectric polarisation of AlGaN/GaN, a positive charge may be present at the interface of AlGaN/GaN, resulting in the formation of a two-dimensional electron gas layer (2DEG) (15). A source terminal (7) and drain terminal (8) may then be formed on the surface of the barrier layer. The source and drain terminal comprise ohmic contacts to the 2DEG. A suitable ohmic contact may be formed through recessing the AlGaN barrier (16) and placing a contact as illustrated in FIG. 4. In another example, not illustrated here, an ohmic contact may be formed through a high concentration of n-doping under a metal contact on the AlGaN barrier (16), wherein the high concentration of n-doping forms a (highly) doped region. A transistor gate terminal (6) may be formed. Any common gate technology may be used for example a p-GaN gate (5) as illustrated in FIG. 4 or an insulated gate.

FIG. 5 depicts a flow diagram of an alternative method 200*b* for forming a wide-bandgap semiconductor transistor over a first section of the surface of the substrate layer as described in method step 200 of method 1000. This method may be particularly suitable if an AlGaN/GaN HEMT is formed on a SiC substrate as illustrated in FIG. 6, or a substrate comprising other wide bandgap semiconductor materials.

Steps 207-210 correspond to steps 201 and 204-206 of method 200*a* respectively. However, a transition layer and buffer layer may not be required for a GaN-on-SiC structure. A buffer layer may be included but may be substantially thinner for the same voltage rating compared to a GaN-on-Si structure. Otherwise, the structure may be formed in a similar manner as described for the structure in FIG. 4, and like reference numerals are provided.

Figure 7:
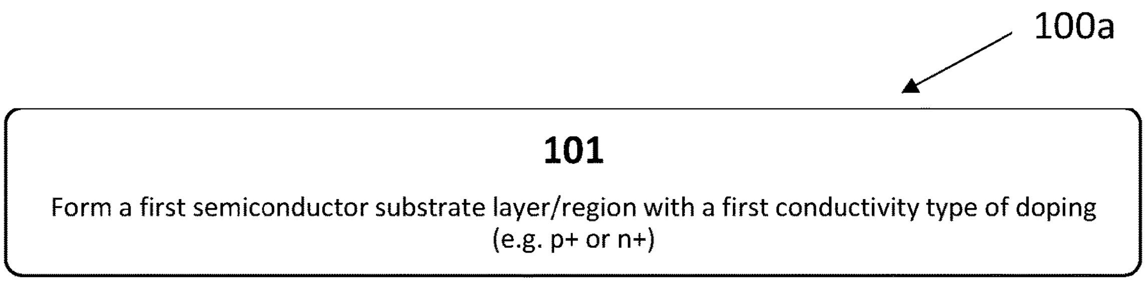
FIG. 7 depicts an example process for performing a method step of the method of FIG. 1.
Figure 8:
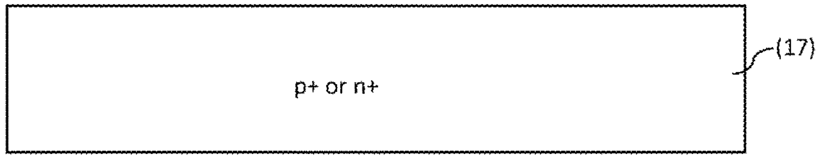
FIG. 8 depicts schematically a structure formed according to the method of FIG. 7.

FIG. 7 depicts a flow diagram of an example method 100*a* for forming a substrate layer as described in method step 100 of method 1000. In this example the method step 101 comprises forming substrate layer that comprise a single region (17) which is either p+ doped or n+ doped as illustrated in FIG. 8. Alternatively, the single region of the substrate layer may be p− doped or n− doped.

Figure 9:
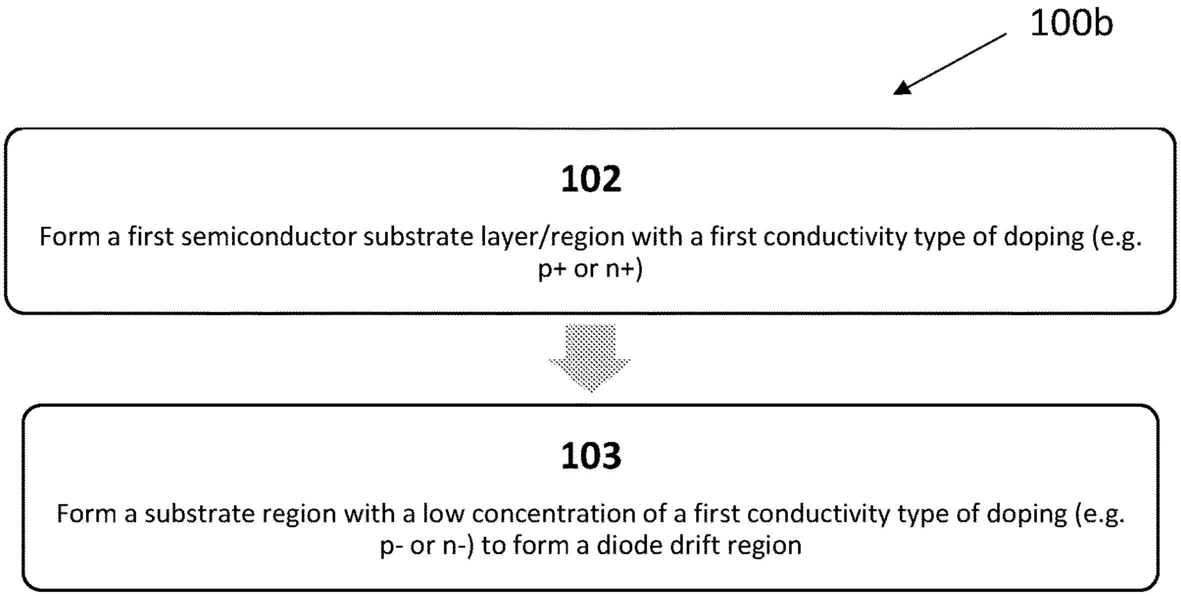
FIG. 9 depicts an example process for performing a method step of the method of FIG. 1.
Figure 10:
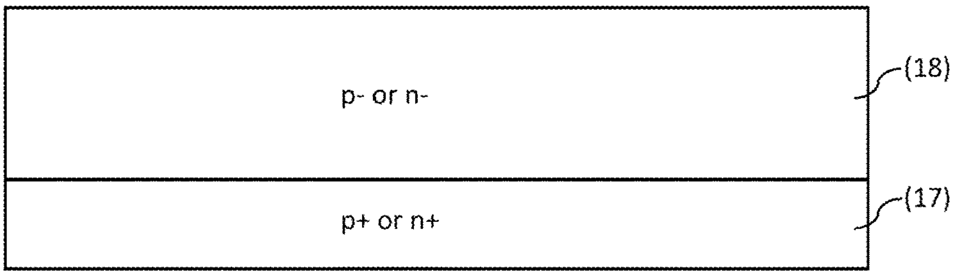
FIG. 10 depicts schematically a structure formed according to the method of FIG. 9.

FIG. 9 depicts a flow diagram of an alternative example method 100*b* for forming the substrate layer. In this example the substrate layer may comprise a substrate layer which comprises two regions as illustrated in FIG. 10; a region with a high doping concentration (e.g. p+ or n+) (17) formed in step 102 and a region with a low doping concentration (e.g. p− or n−) (18) formed in step 103. The low doping concentration region (18) may act as the drift region for the high voltage diode associated with the substrate layer formed as described in FIG. 1.

Figure 11:
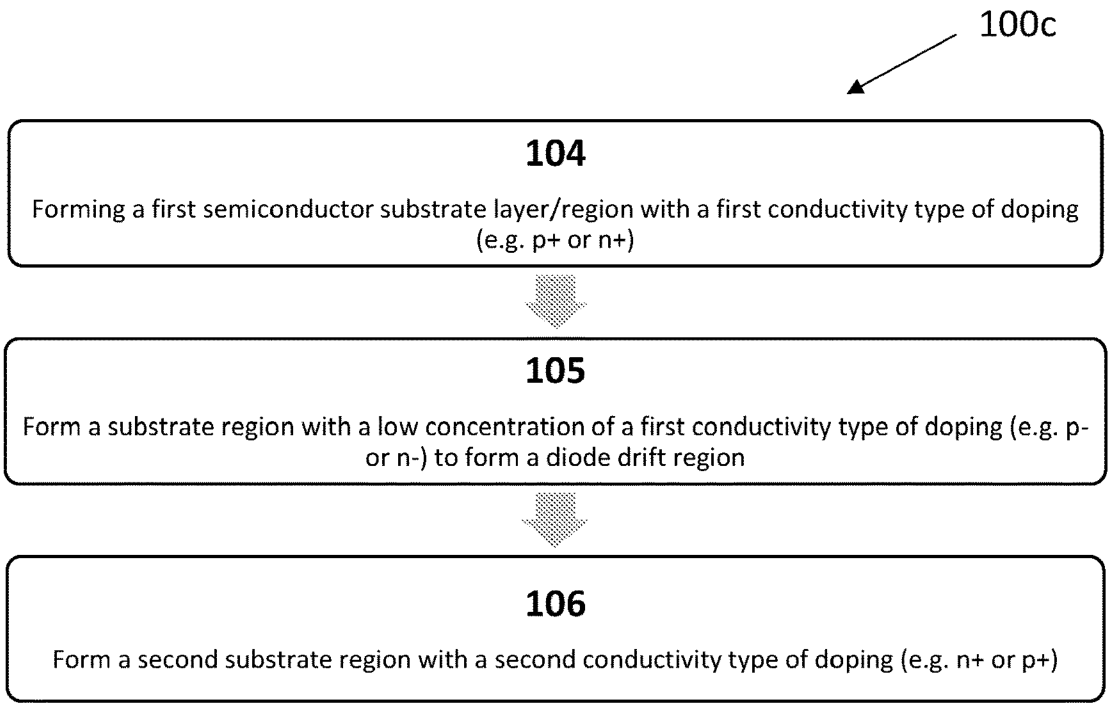
FIG. 11 depicts an example process for performing a method step of the method of FIG. 1.
Figure 12:
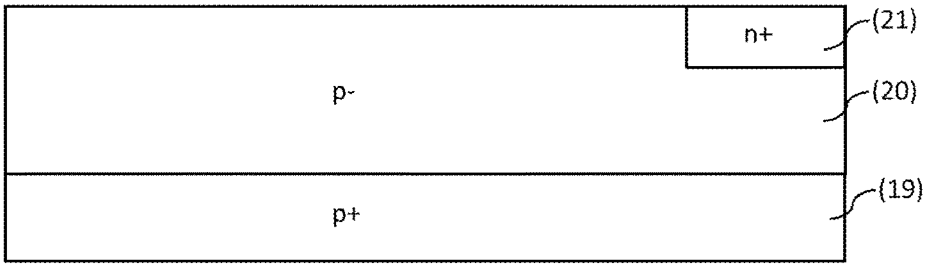
FIG. 12 depicts schematically a structure formed according to the method of FIG. 11.
Figure 13:
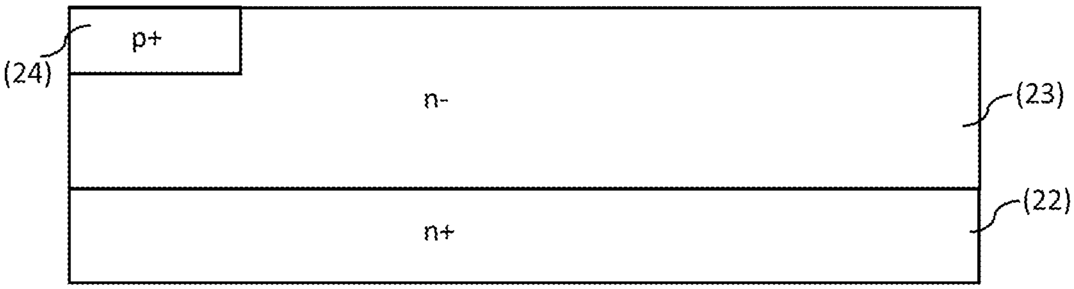
FIG. 13 depicts schematically a structure formed according to the method of FIG. 11.

FIG. 11 depicts a flow diagram of a further alternative example method 100*c* for forming the substrate layer. In this example the substrate layer may comprise three regions as illustrated in FIG. 12 and FIG. 13; a region (19)/(22) with a high doping concentration (e.g. p+ or n+) formed in step 104 and a region (20)/(23) with a low doping concentration (e.g. p− or n−) formed in step 105. The low doping concentration may act as the drift region for the substrate layer diode formed as described in FIG. 1. An additional high doping concentration region of a second conductivity type may be formed in step 106 near the surface of the wafer, for example n+ region (21) in FIG. 12 and p+ region (24) in FIG. 13.

Figure 14:
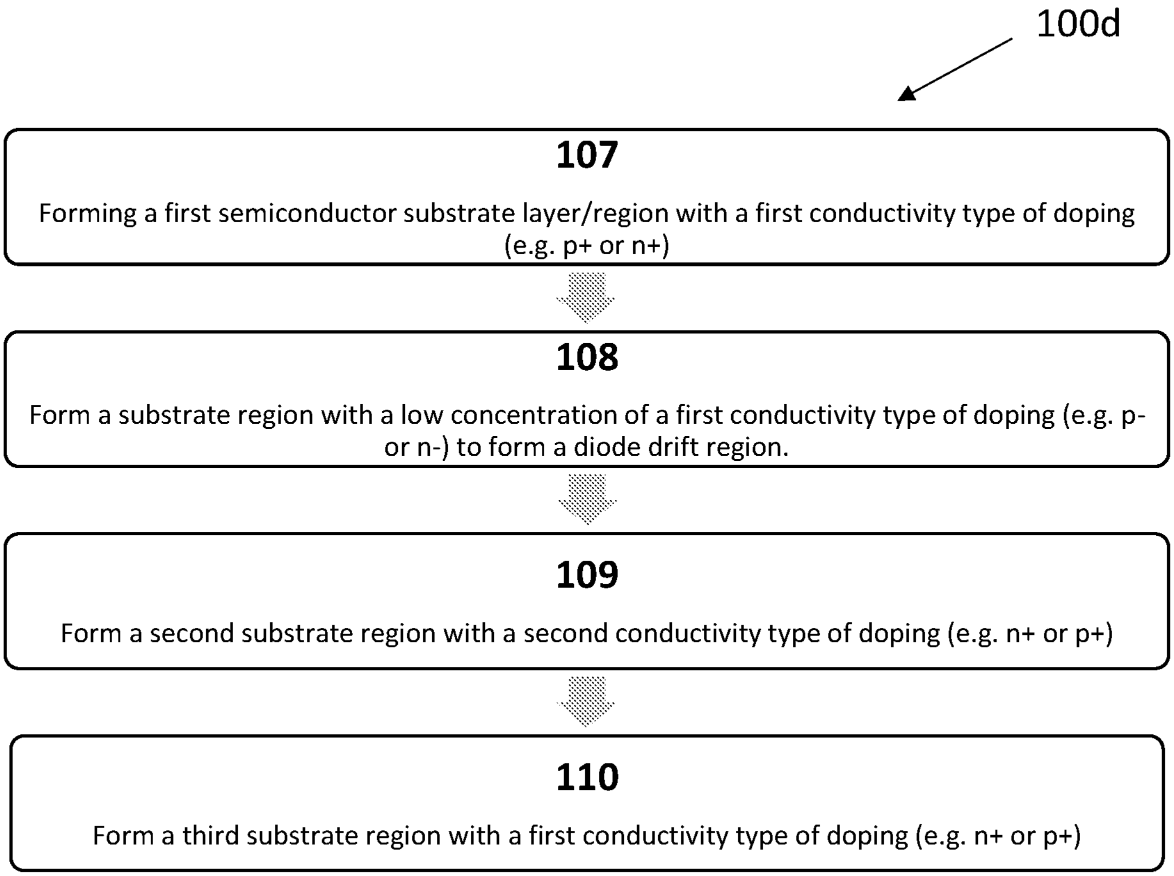
FIG. 14 depicts an example process for performing a method step of the method of FIG. 1.
Figure 15:
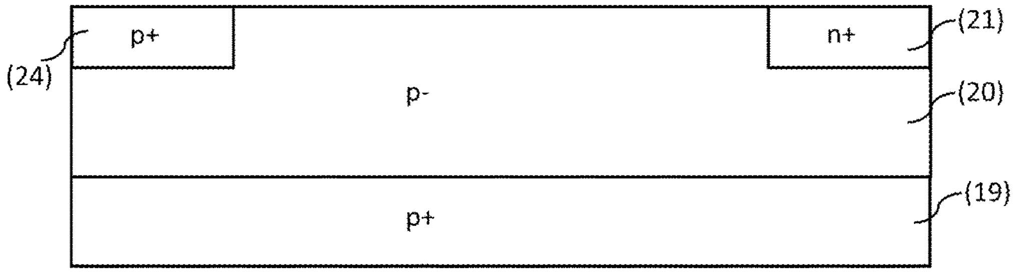
FIG. 15 depicts schematically a structure formed according to the method of FIG. 14.
Figure 16:
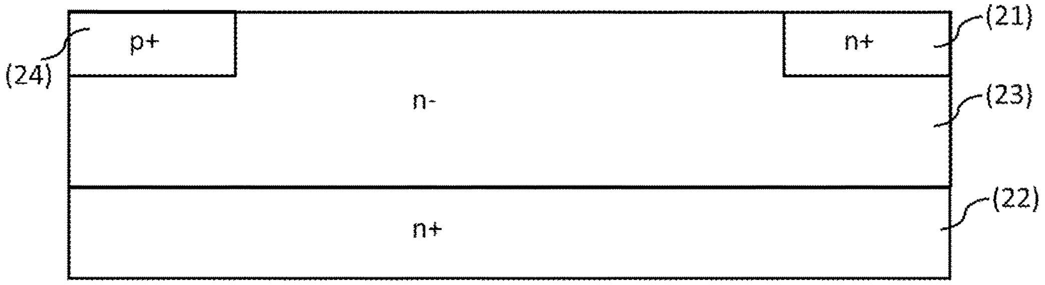
FIG. 16 depicts schematically a structure formed according to the method of FIG. 14.

FIG. 14 depicts a flow diagram of a further alternative example method 100*d* for forming the substrate layer. Steps 107-109 of method 100*d* are similar to the steps 104-106 of method 100*c*. However, method 100*d* comprises an additional step 110. The additional step 110 involves the formation of an additional high doping concentration region, which may be of a first conductivity type. Examples of possible resulting structures are illustrated in FIG. 15 and FIG. 16. FIG. 15 is similar to FIG. 12 but comprises an additional high doping concentration region (24). FIG. 16 is similar to FIG. 13 but comprises an additional high doping concentration region (21).

Figure 17:
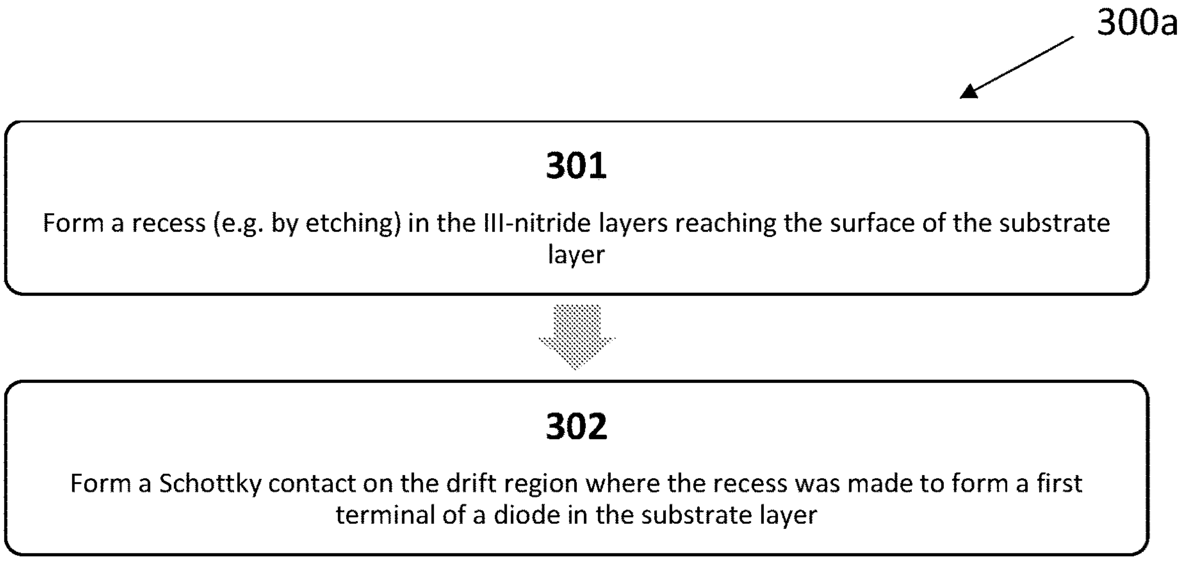
FIG. 17 depicts an example process for performing a method step of the method of FIG. 1.

FIG. 17 depicts a flow diagram of an example method 300*a* for forming a first terminal on the substrate layer as described in step 300 of method 1000. As described in previous examples the formation of a wide bandgap transistor may involve the epitaxial growth of III-V nitride layers on the substrate. A recess of the III-nitride layers may be required in order to access the substrate surface for the formation of a contact (which may act as the first terminal of the substrate diode). Method 300*a* therefore comprises forming a recess (e.g. by etching) in the III-nitride layers in step 301, the recess exposing or otherwise reaching a surface of the substrate layer. The recess may be formed over the drift region of the diode. In step 302, a Schottky contact is formed which may act as a terminal of the diode.

Figure 18:
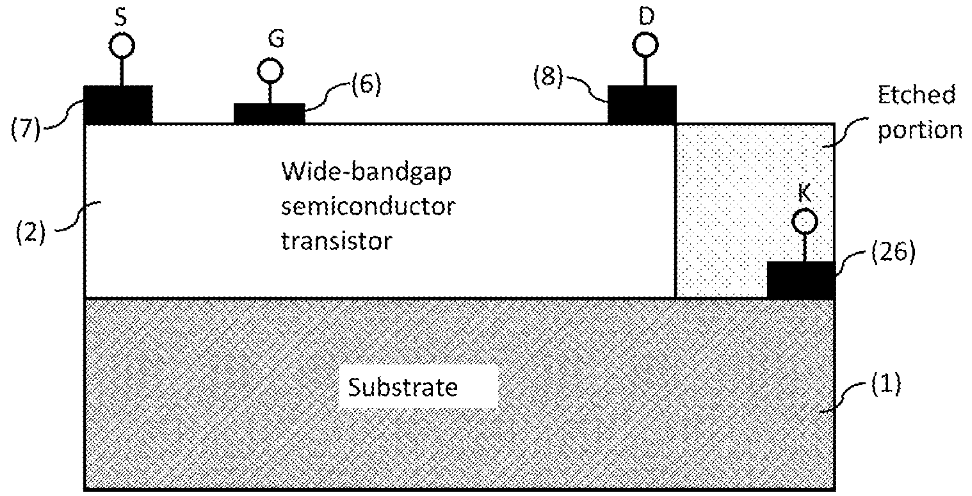
FIG. 18 depicts schematically a structure formed according to the method of FIG. 17.
Figure 19:
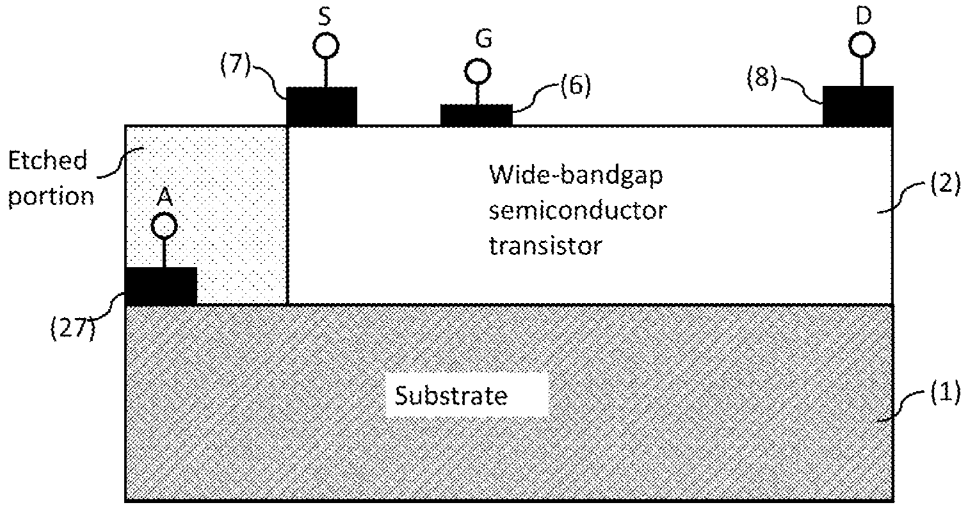
FIG. 19 depicts schematically a structure formed according to the method of FIG. 17.

FIG. 18 illustrates a schematic of one example where the recess and contact formation are made on the side of the drain contact of the wide-bandgap semiconductor transistor and wherein the contact formed (26) may act as the cathode (K) of the diode in the substrate layer (1). FIG. 19 illustrates a schematic of one example where the recess and contact formation are made on the side of the source contact of the wide-bandgap semiconductor transistor and wherein the contact formed (27) may act as the anode (A) of the diode in the substrate layer (1). In the schematics illustrated, the substrate layer (1) and the wide-bandgap transistor (2) are illustrated as one region for simplification. These regions may comprise, but are not limited to, any of the more detailed examples of wide bandgap transistors or substrate layers illustrated herein. In the method described in chart 300*a*, a Schottky contact may be formed However, it will be understood that other suitable contacts may also be used.

Figure 20:
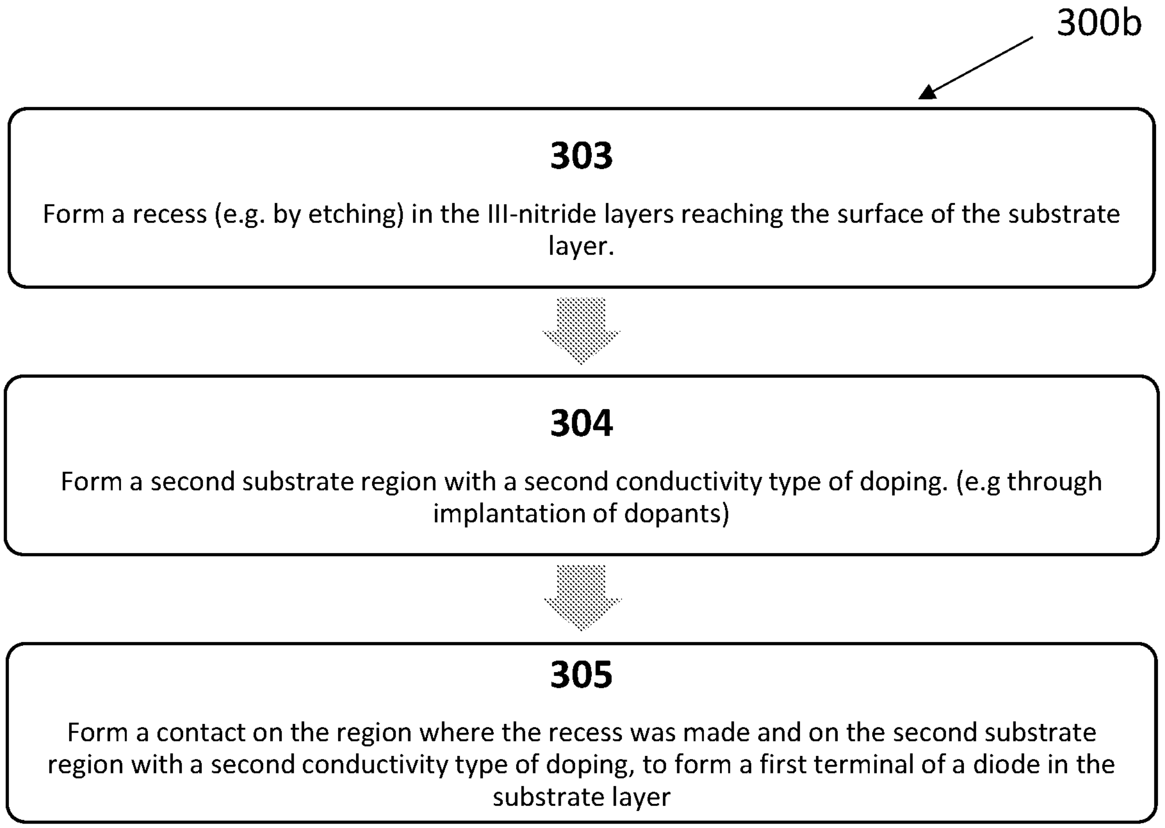
FIG. 20 depicts an example process for performing a method step of the method of FIG. 1.

FIG. 20 depicts a flow diagram of an alternative example method 300*b* for forming the first terminal on the substrate layer as described in step 300 of method 1000. In this method 300*b*, a recess in the III-nitride layers is made in step 303, similarly to step 301 of method 300*a*. Before a contact is formed on the substrate, a highly doped region is formed in step 304. This region may be formed for example through the implantation of dopants. The implantation of dopants may be self-aligned to the recess region. A contact may be formed on the highly doped substrate region in step 305. This may enable a good or otherwise suitable ohmic contact to be made on the substrate layer.

Figure 21:
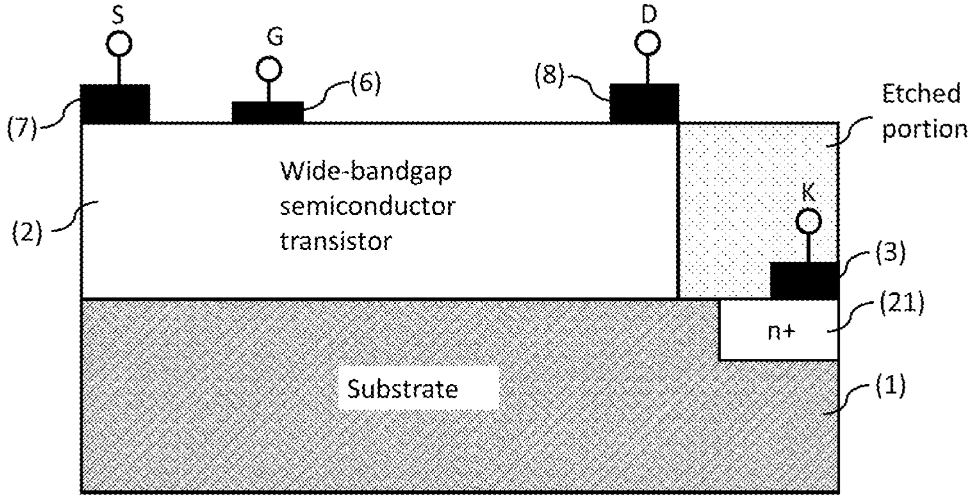
FIG. 21 depicts schematically a structure formed according to the method of FIG. 20.
Figure 22:
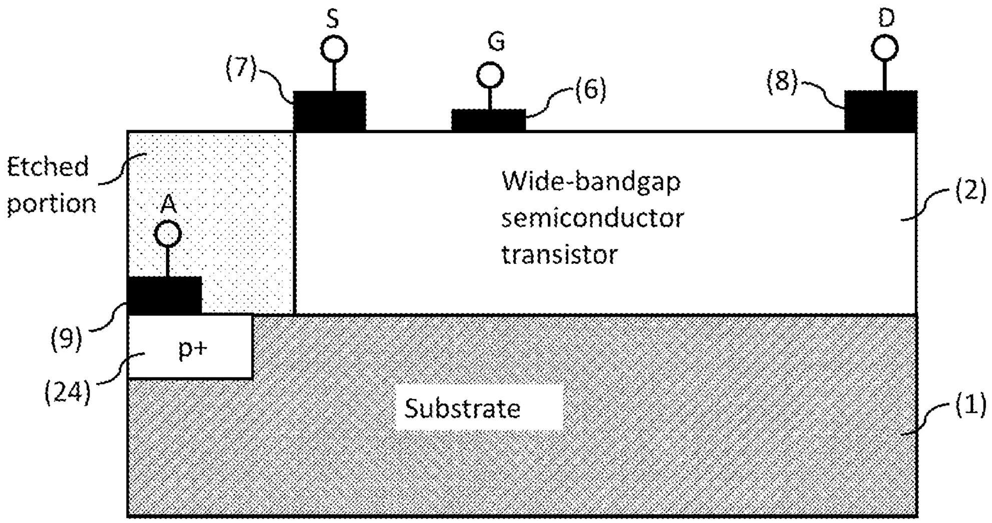
FIG. 22 depicts schematically a structure formed according to the method of FIG. 20.

FIG. 21 illustrates a schematic of one example of a structure formed via method 300*b*, where in an n+ region (21) is formed, and a contact (3) is formed. FIG. 22 illustrates a schematic of one example of another structure formed via method 300*b*, where in an p+ region (24) is formed, and a contact (9) is formed.

Figure 23:
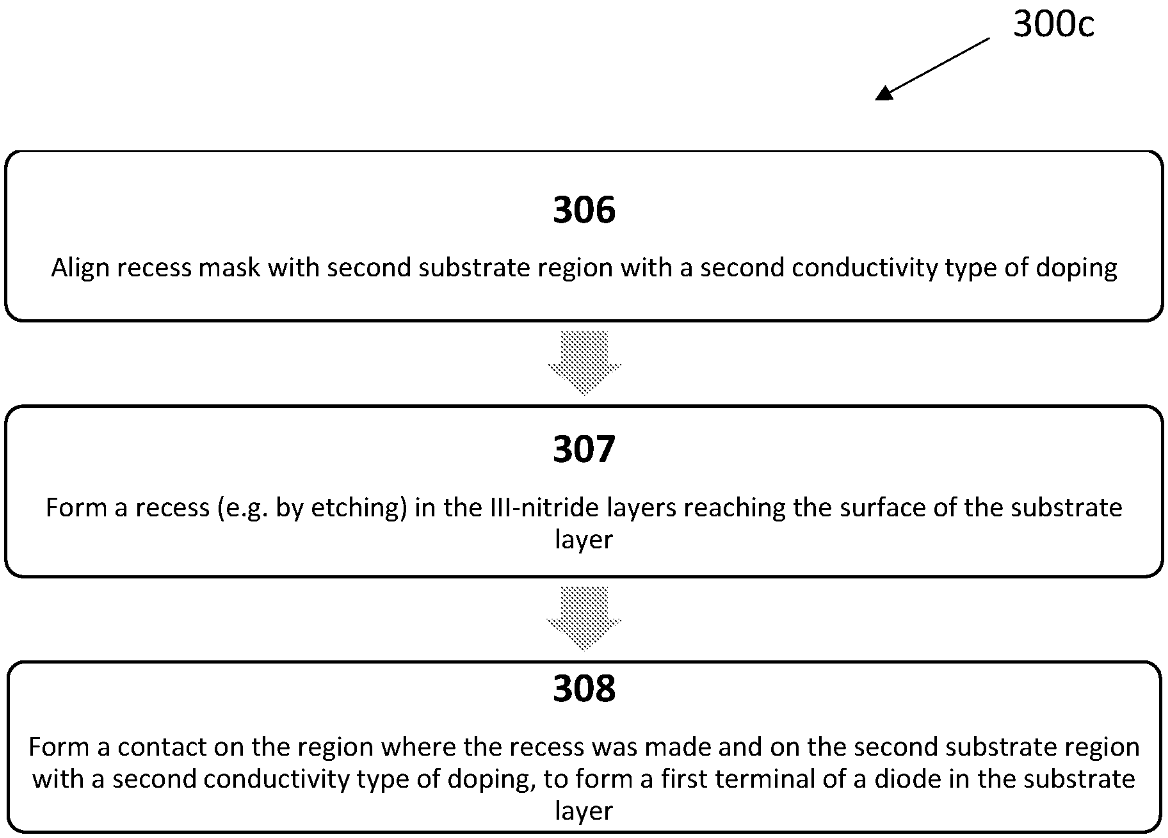
FIG. 23 depicts an example process for performing a method step of the method of FIG. 1.

FIG. 23 depicts a flow diagram of a further alternative example method 300*c* for forming the first terminal on the substrate layer. Method 300*c* may result in similar or the same structures as illustrated in FIG. 21 and FIG. 22, however alternative steps may be followed. Before the steps in the method of chart 300*c* are implemented, n+ region (21) and p+ region (24) (in the examples illustrated) may have already been formed in the substrate. The region(s) may have been formed before the III-V nitride layers were grown, for example, as described in method 100*c*. Therefore, the method 300*c* comprises a first step 306 of aligning the recess mask with the highly doped regions. Following this, a contact may be formed in steps 307 and 308 that generally correspond to e.g. steps 303 and 305 of method 300*b*.

Figure 24:
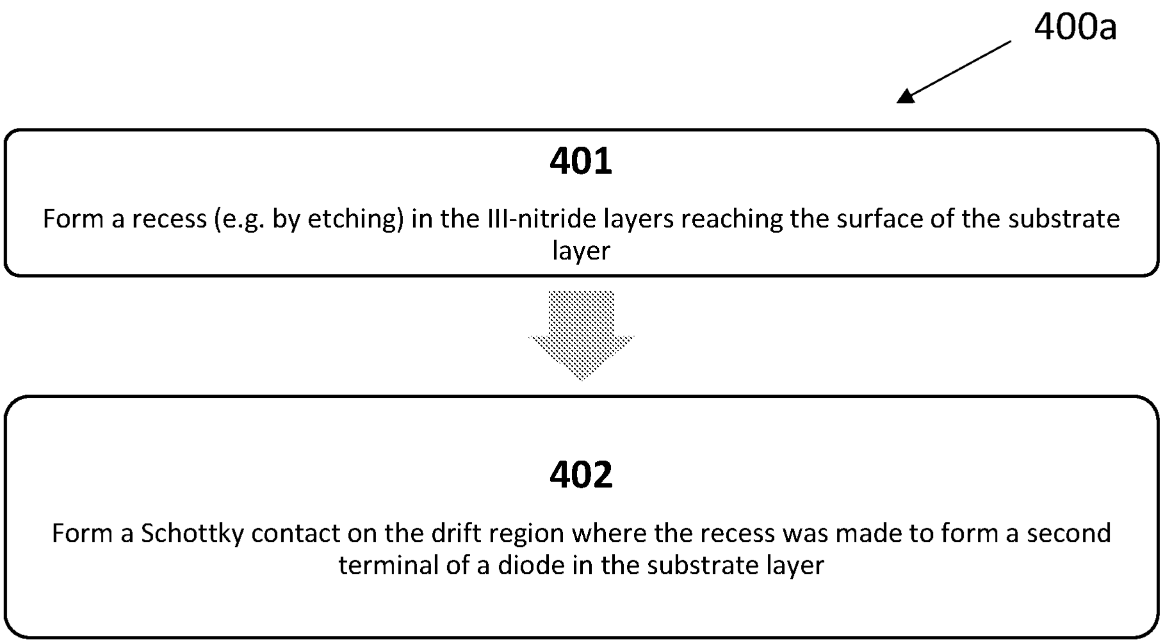
FIG. 24 depicts an example process for performing a method step of the method of FIG. 1.

FIG. 24 depicts a flow diagram of an example method 400*a* for forming a second terminal on the substrate layer as described in step 400 of method 1000. With method 400*a*, the second terminal of the diode in the substrate may be formed on the surface of the substrate. The method 400*a* comprises forming a recess (e.g. by etching) in the III-nitride layers, the recess exposing or otherwise reaching a surface of the substrate layer. The recess may be formed over the drift region of the diode. In step 402, a Schottky contact is formed which may act as a second terminal of the diode.

Figure 25:
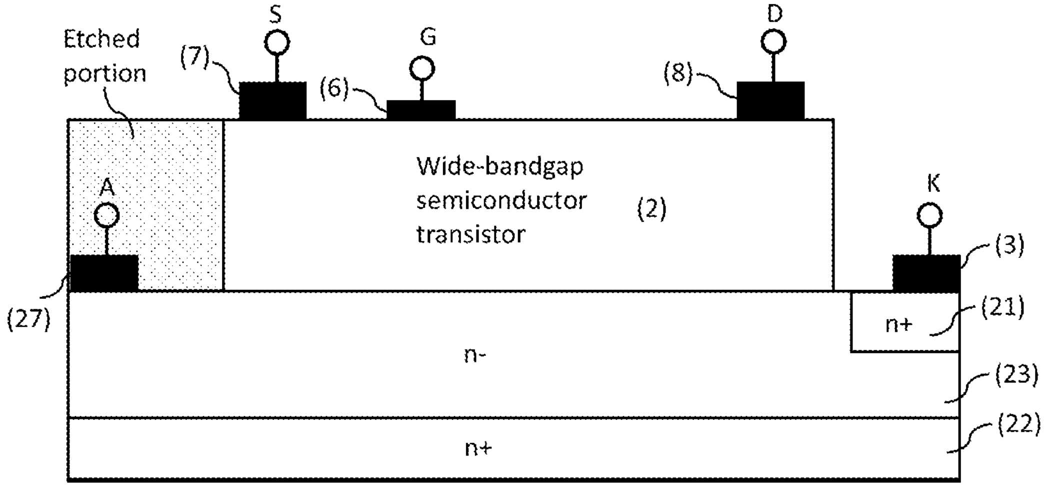
FIG. 25 depicts schematically a structure formed according to the method of FIG. 24.

FIG. 25 illustrates an example structure formed according to the method 400*a*, where a Schottky contact (27) is formed on the substrate following a recess of the III-nitride layers. In this example, contact (27) forms the anode terminal (A).

Figure 26:
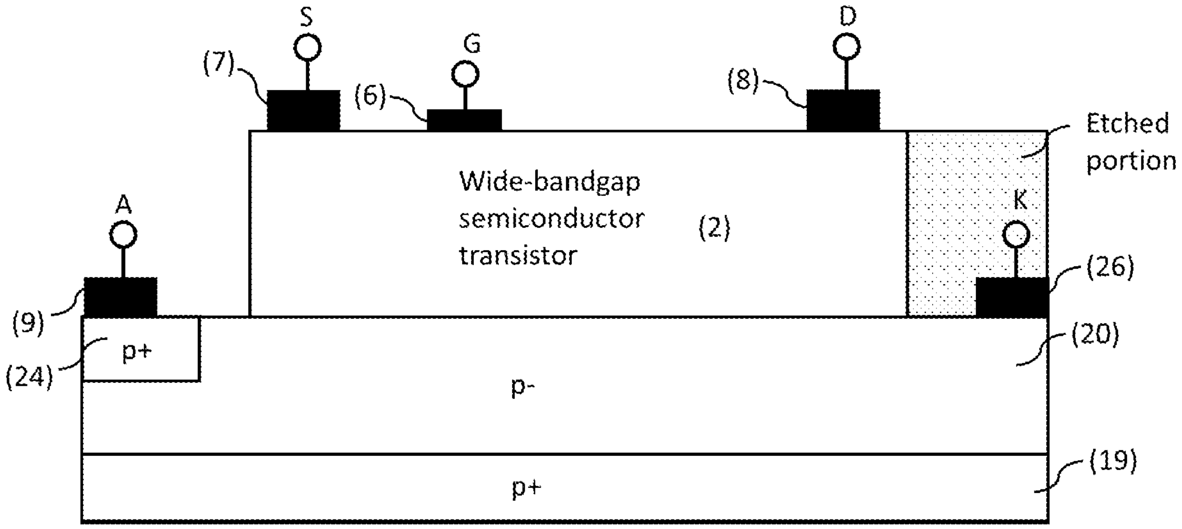
FIG. 26 depicts schematically a structure formed according to the method of FIG. 24.

FIG. 26 illustrates an alternative example structure formed according to the method 400*a*, where a Schottky contact (26) is formed on the substrate following a recess of the III-nitride layers. In this example, contact (26) forms the cathode terminal (K).

Figure 27:
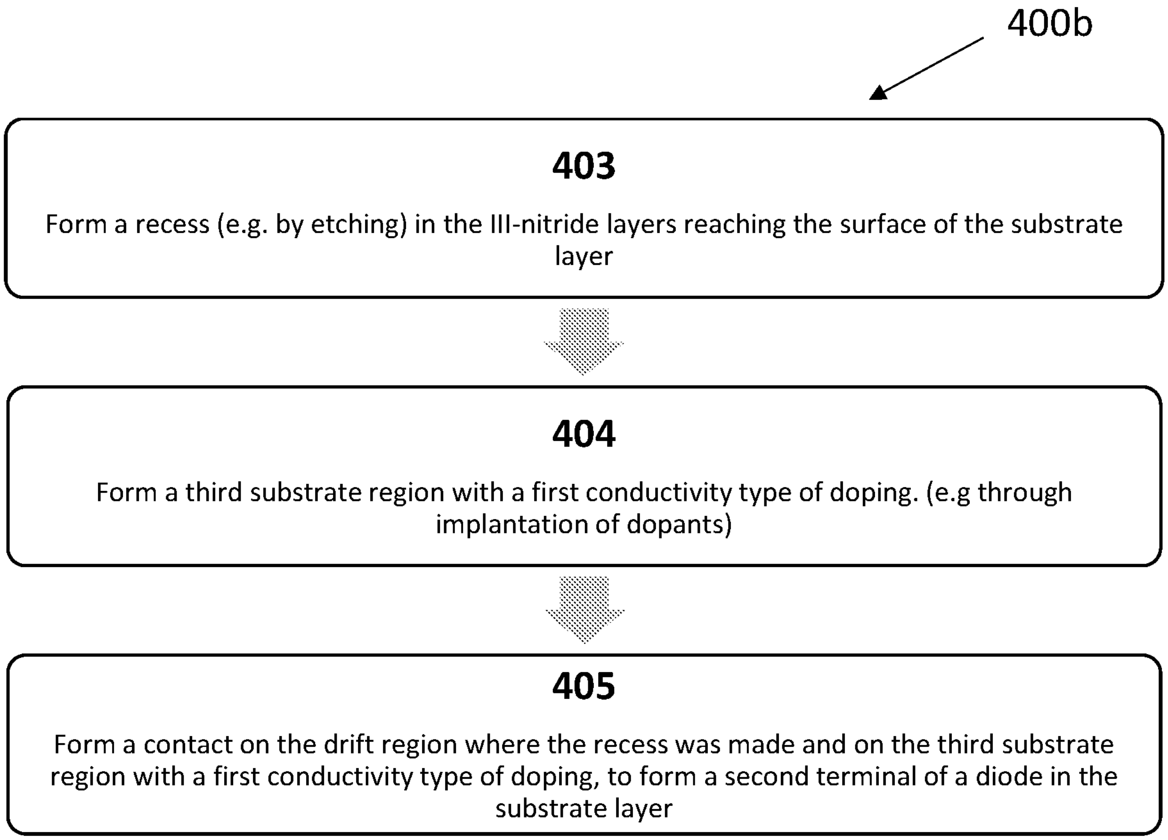
FIG. 27 depicts an example process for performing a method step of the method of FIG. 1.

FIG. 27 depicts a flow diagram of an alternative example method 400*b* for forming the second terminal on the substrate layer. The steps 403-405 of method 400*b* generally correspond to the steps 303-305 of method 300*b* for forming the first terminal. After recessing the III-nitride layers in step 403, a highly doped region is formed in step 404, before a contact is formed on the substrate in step 405. This (highly) doped region may be formed for example through the implantation of dopants. The implantation of dopants may be self-aligned to the recess region. A contact may be formed on the highly doped substrate region. This may enable a good ohmic contact to be made on the substrate layer.

Figure 28:
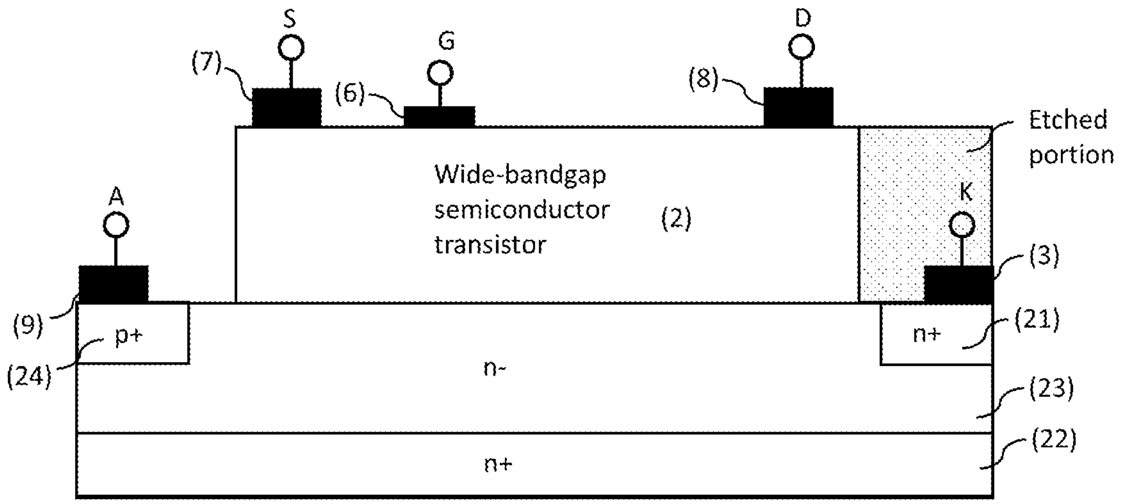
FIG. 28 depicts schematically a structure formed according to the method of FIG. 27.
Figure 29:
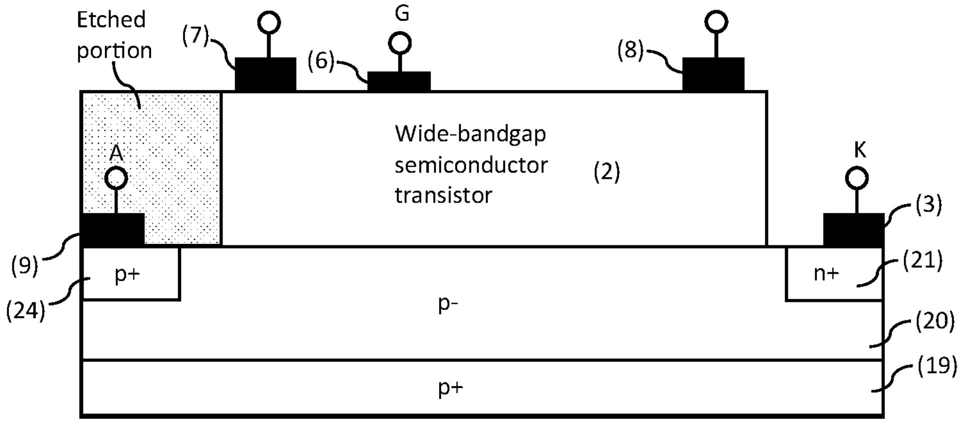
FIG. 29 depicts schematically a structure formed according to the method of FIG. 27.

FIG. 28 illustrates a schematic of one example of a structure formed with method 400*b*, where an n+ region (21) is formed in the etched portion, and a contact (3) is formed over the n(+) region (21). FIG. 29 illustrates a schematic of one example of an alternative structure formed with method 400*b*, where a p+ region (24) is formed in the etched portion, and a contact (9) is formed over the p+ region (24).

Figure 30:
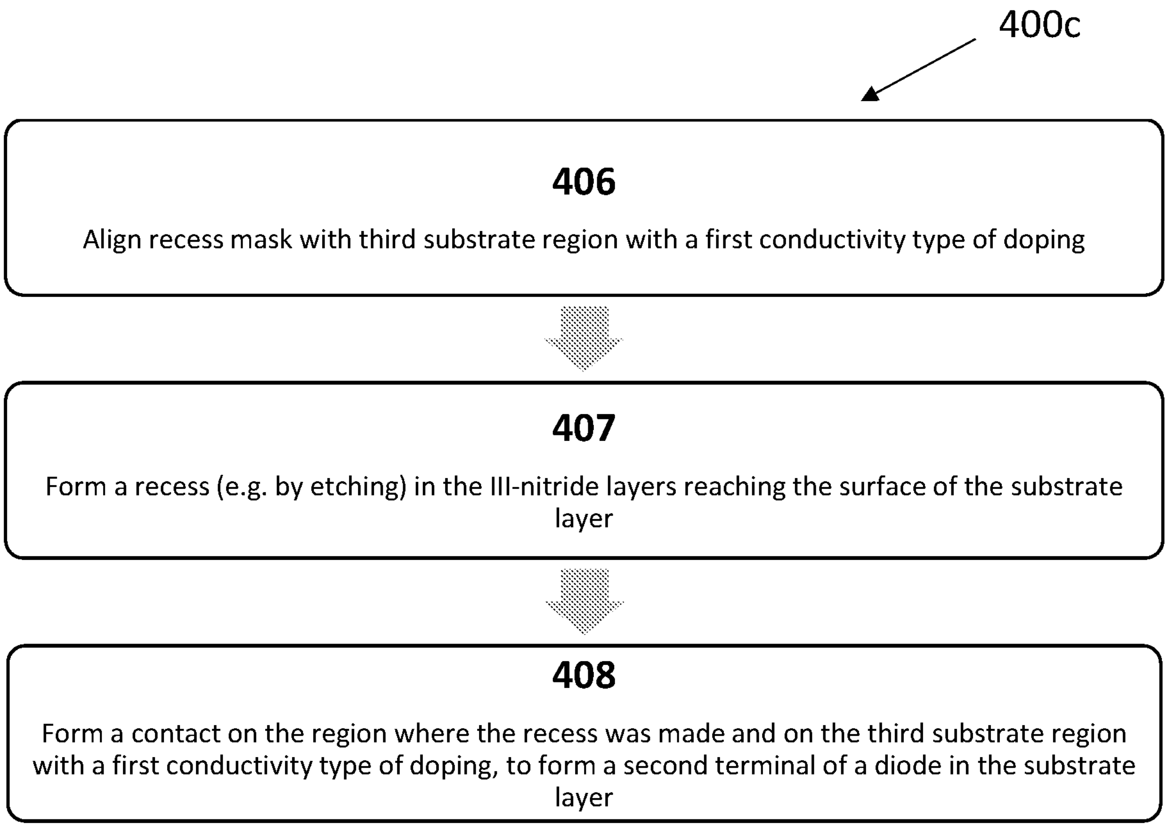
FIG. 30 depicts an example process for performing a method step of the method of FIG. 1.

FIG. 30 depicts a flow diagram of a further alternative example method 400*c* for forming the second terminal on the substrate layer. This method may result in the same or similar structures illustrated in FIG. 28 and FIG. 29, however alternative steps may be followed. Before the steps in the method of chart 400*c* are implemented, n+ region (21) and p+ region (24) (in the examples illustrated) may have already been formed in the substrate. The region would have been formed before the III-V nitride layers be grown, for example, in accordance with the steps of method 100*d*. Therefore, the method 400*c* comprises a first step 406 of aligning the recess mask with the highly doped regions. Following this, a contact may be formed in steps 407 and 408 that generally correspond to e.g. steps 403 and 405 of method 400*b*.

Figure 31:
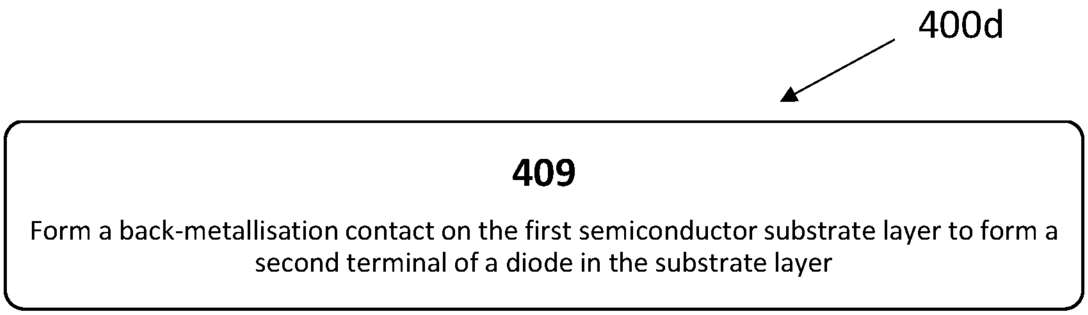
FIG. 31 depicts an example process for performing a method step of the method of FIG. 1.
Figure 32:
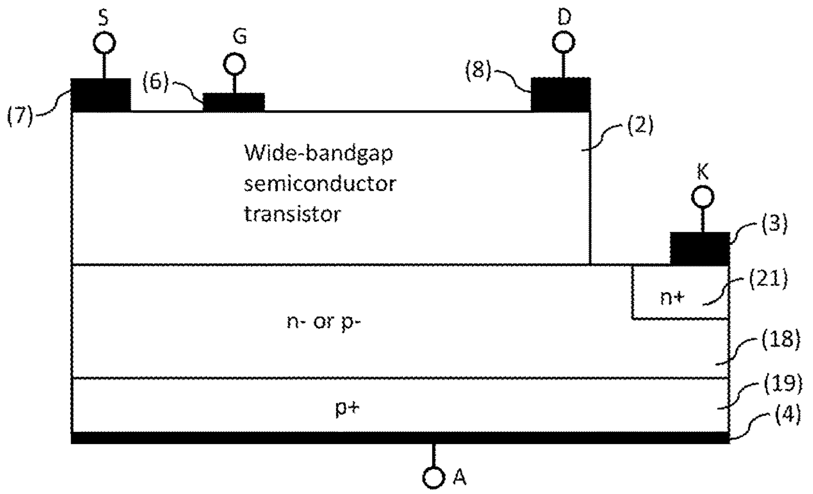
FIG. 32 depicts schematically a structure formed according to the method of FIG. 31.
Figure 33:
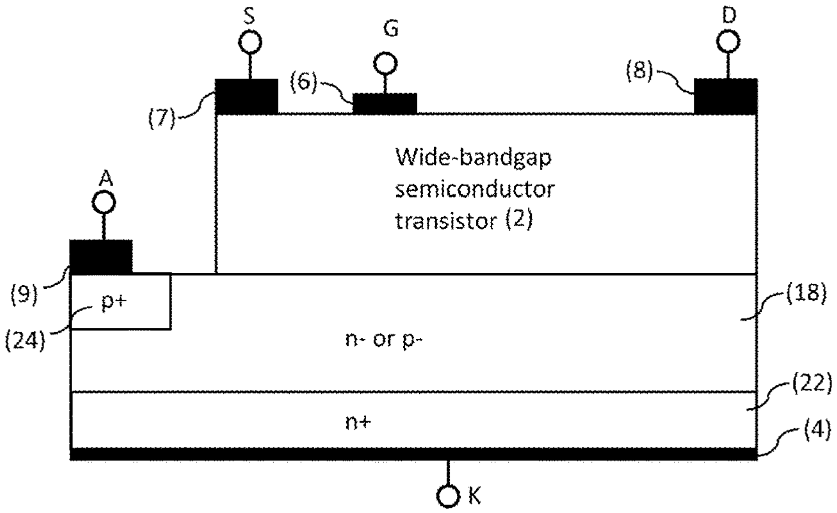
FIG. 33 depicts schematically a structure formed according to the method of FIG. 31.

FIG. 31 depicts a flow diagram of a further alternative example method 400*d* for forming a second terminal on the substrate layer. In this method, the second terminal is formed on the back-end or "bottom" side of the substrate in step 409, resulting in the formation of a back-metallisation contact (4) as depicted in FIGS. 32 and 33. The contact may be formed for example by physical vapour deposition (PVD) or sintering.

FIG. 32 illustrates a schematic of one example where an anode contact (A) of the substrate diode is formed according to method 400*d*. FIG. 33 illustrates a schematic of one example where a cathode contact (K) of the substrate diode is formed according to method 400*d*.

Figure 34:
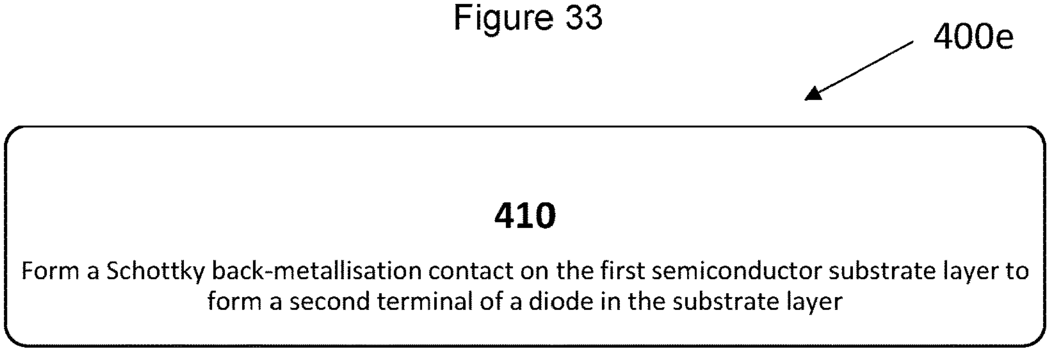
FIG. 34 depicts an example process for performing a method step of the method of FIG. 1.
Figure 35:
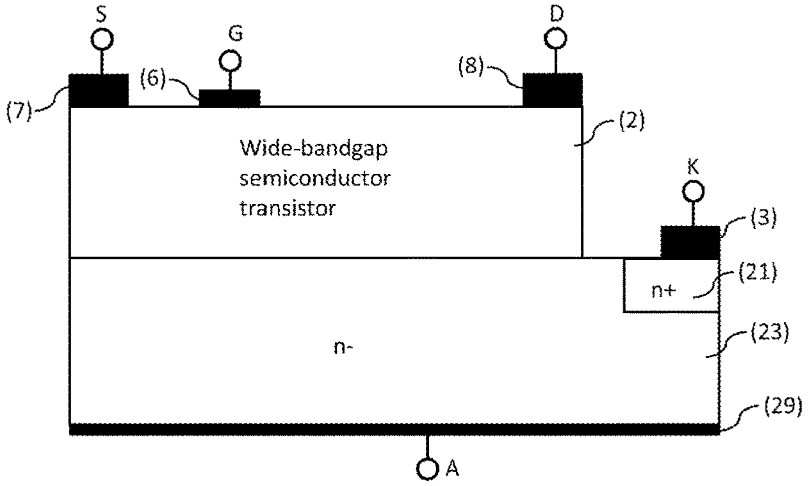
FIG. 35 depicts schematically a structure formed according to the method of FIG. 34.
Figure 36:
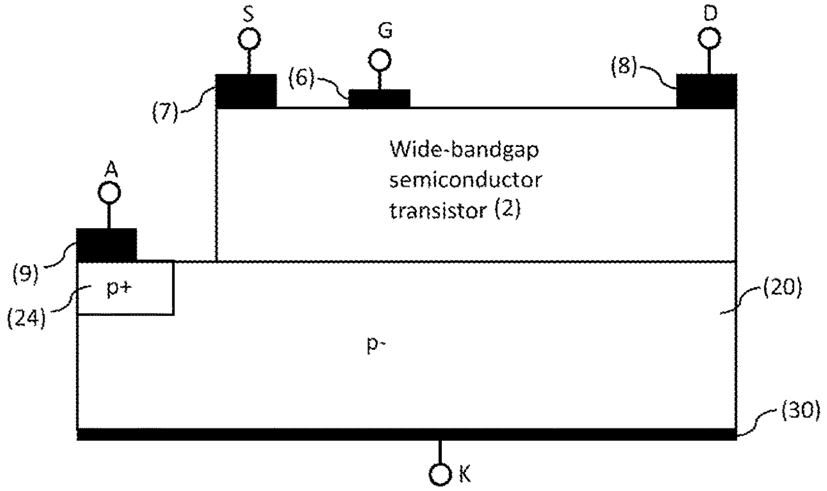
FIG. 36 depicts schematically a structure formed according to the method of FIG. 34.
Figure 37:
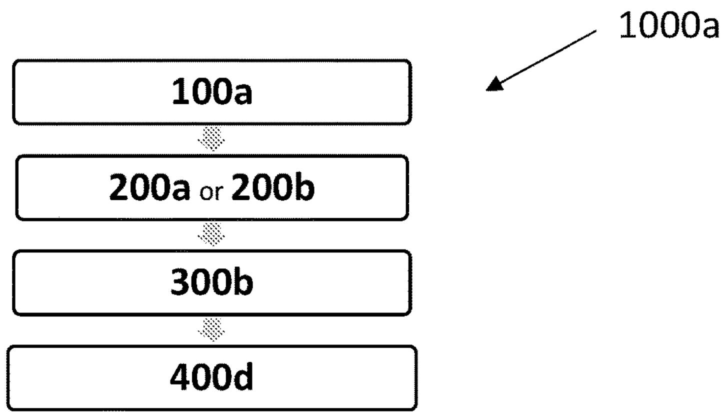
FIG. 37 depicts an example method according to the present disclosure.

FIG. 34 depicts a flow diagram of a further alternative example method 400*e* for forming a second terminal on the substrate layer. In this method, the second terminal is again formed on the back-end of the substrate in step 410, resulting in the formation of a back-metallisation contact (29) as depicted in FIGS. 35 and 36. In this example, the back metallisation contact formed may be a Schottky contact.

FIG. 35 illustrates a schematic of one example where an anode contact (29) of the substrate diode is formed according to method 400*e*. FIG. 36 illustrates a schematic of one example where a cathode contact (30) of the substrate diode is formed according to method 400*e*.

FIG. 37, FIG. 40, FIG. 41, FIG. 42, FIG. 43 illustrates example methods comprising various combinations of the embodiments method steps 100, 200, 300 and 400 described above, according to the framework outlined in method 1000. Method steps described in previous examples may be combined to give structures with a wide bandgap transistor on a substrate layer; wherein at least part of the diode is directly located under at least part of the wide-bandgap semiconductor transistor.

Figure 38:
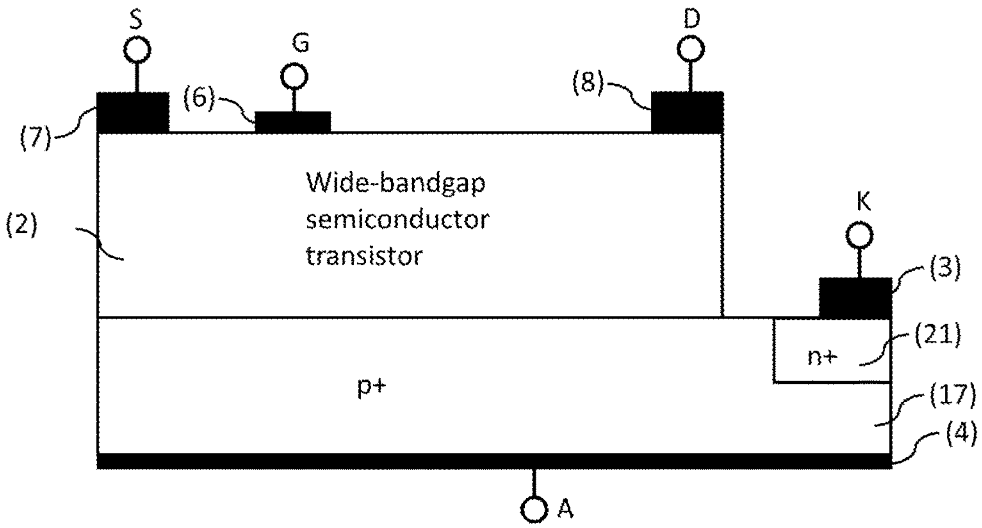
FIG. 38 depicts schematically a structure formed according to the method of FIG. 37.
Figure 39:
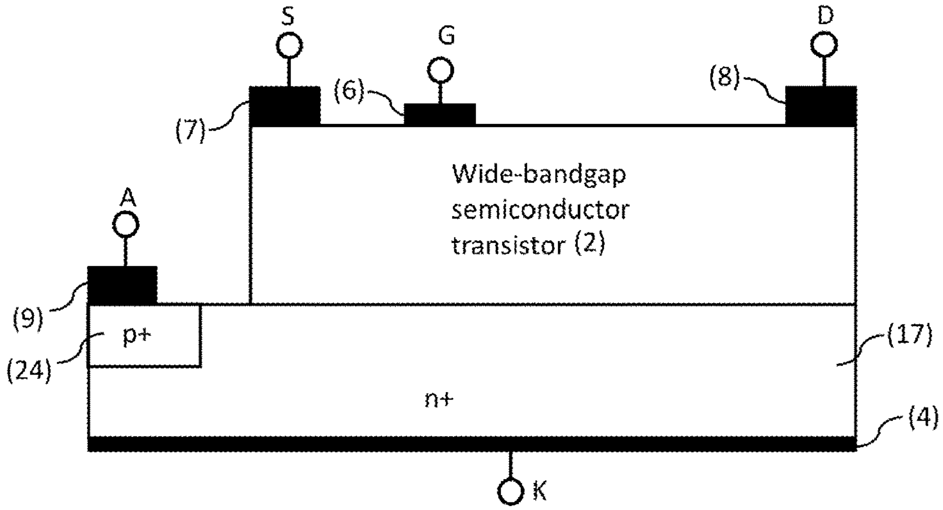
FIG. 39 depicts schematically a structure formed according to the method of FIG. 37.
Figure 40:
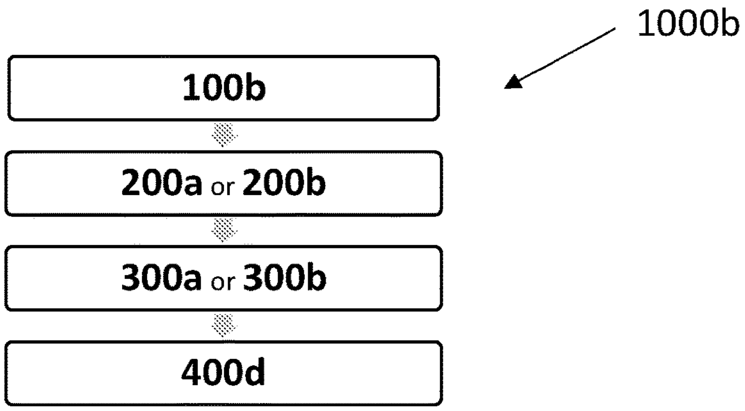
FIG. 40 depicts an example method according to the present disclosure.
Figure 41:
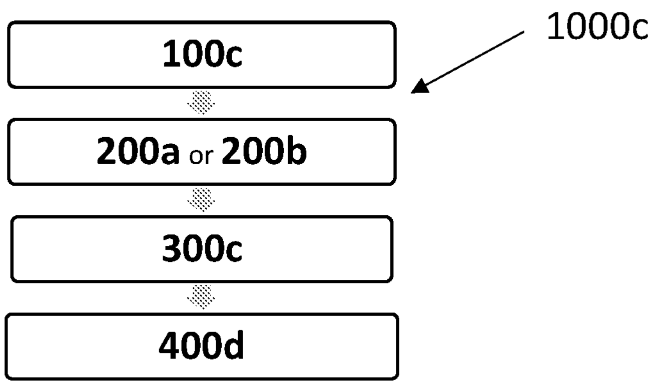
FIG. 41 depicts an example method according to the present disclosure.
Figure 42:
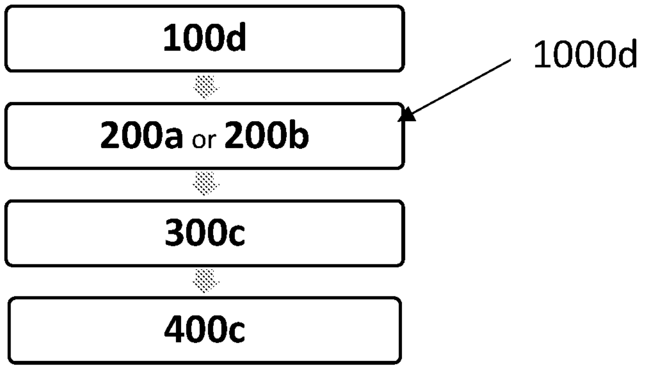
FIG. 42 depicts an example method according to the present disclosure.
Figure 43:
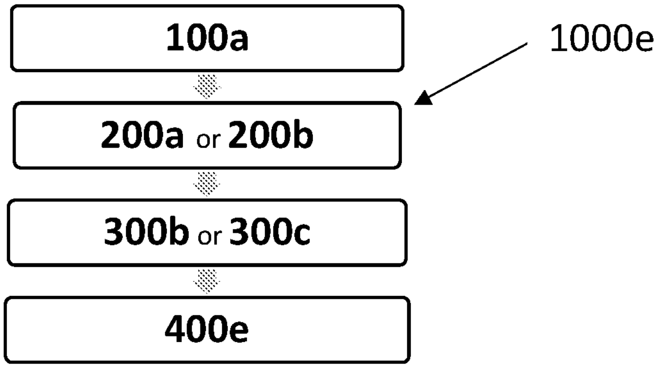
FIG. 43 depicts an example method according to the present disclosure.

Method 1000*a* comprises method steps 100*a*, 200*a* or 200*b*, 300*b*, and 400*d*, and may result in a structure as illustrated in FIG. 38 and FIG. 39.

Method 1000*b* comprises method steps 100*b*, 200*a* or 200*b*, 300*a* or 300*b*, and 400*d*, and may result in a structure as illustrated in FIG. 32 and FIG. 33.

Method 1000*c* comprises method steps 100*c*, 200*a* or 200*b*, 300*c*, and 400*d*, and may result in a structure as illustrated in FIG. 32 and FIG. 33.

Method 1000*d* comprises method steps 100*d*, 200*a* or 200*b*, 300*c*, and 400*c*, and may result in a structure as illustrated in FIG. 28 and FIG. 29.

Method 1000*e* comprises method steps 100*a*, 200*a* or 200*b*, 300*b* or 300*c*, and 400*e*, and may result in a structure as illustrated in FIG. 35 and FIG. 36.

It will be understood that the various examples of method steps 100, 200, 300 and 400 described above may be combined in any other arrangement not listed above.

The method may comprise forming a second heterojunction transistor, for example a second GaN HEMT, over the substrate layer. The second heterojunction transistor may be formed via the same or a different method as the first heterojunction transistor. For example, both heterojunction transistors may be formed according to method 1000*a*, or the first transistor may be formed according to method 1000*a* while the second heterojunction transistor is formed according to method 1000*b*. Any other combination may also be used. Further (e.g. third, fourth, etc.) transistors may also be formed. The first and second heterojunction transistors may be connected in a half bridge.

The skilled person will understand that in the preceding description, positional terms such as 'top', 'front', 'side', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A method of making a power device, the method comprising:

forming a substrate layer, wherein the substrate layer comprises a doped semiconductor material and a highly doped region;

forming a drift region of a high voltage diode in the substrate layer, wherein a doping concentration of the highly doped region is greater than a doping concentration of the drift region, and wherein the highly doped region in the substrate is doped with a first conductivity type, and the drift region is doped with the first conductivity type;

forming a wide-bandgap semiconductor transistor over, and in physical contact with, a first section of a first surface of the substrate layer, wherein the first section includes at least part of the drift region of the high voltage diode;

forming a first terminal over a second section of the first surface of the substrate layer;

forming a second terminal over a second surface of the substrate layer, wherein the second surface is opposite the first surface, wherein forming the second terminal comprises forming a contact over the second surface of the substrate layer, and wherein the method comprises forming the drift region and the first and the second terminal such that a high voltage diode is formed in the substrate layer, wherein at least part of the diode is located below at least part of the wide-bandgap semiconductor transistor.

2. A method as in claim 1, wherein the drift region comprises a doped semiconductor material with a first conductivity type; and wherein forming the first terminal on the substrate layer comprises:

forming a recess in the wide-bandgap semiconductor transistor over the second section of the substrate; and implanting a highly doped region of a second conductivity type in the second section of the substrate layer, wherein the second conductivity type is different to the first conductivity type; and forming a contact over the highly doped region.

3. A method as in claim 1, wherein:

the first conductivity type is p-type; and forming the first terminal comprises:

forming a recess in the wide-bandgap semiconductor transistor over the second section of the substrate; and forming a Schottky contact over the second section of the substrate layer; wherein the first terminal is a cathode terminal of the diode.

4. A method as in claim 3, wherein:

forming the second terminal comprises:

implanting the highly doped region of a first conductivity type in the third section of the substrate layer, and forming a contact over the highly doped region.

5. A method as in claim 3, wherein: forming the second terminal comprises: forming a contact over the second surface of the substrate layer.

6. A method as in claim 1, wherein:

the first conductivity type is n-type; and forming the first terminal comprises:

forming a recess in the wide-bandgap semiconductor transistor over the second section of the substrate; and forming a Schottky contact over the second section of the substrate layer; wherein the first terminal is an anode terminal of the diode.

7. A method as in claim 6, wherein:

forming the second terminal comprises:

implanting the highly doped region of a first conductivity type in the third section of the substrate layer, and forming a contact over the highly doped region.

8. A method as in claim 6, wherein: forming the second terminal comprises: forming a contact over the second surface of the substrate layer.

9. A method as in claim 1, wherein:

the first conductivity type is p-type;

the first terminal is a cathode terminal of the diode; and the second terminal is an anode terminal of the diode.

10. A method as in claim 1, wherein:

the first conductivity type is n-type;

the first terminal is an anode terminal of the diode; and the second terminal is a cathode terminal of the diode.

11. A method as in claim 1, wherein:

the wide-bandgap semiconductor transistor is a gallium nitride high electron mobility transistor (GaN HEMT); and the doped semiconductor material is silicon; and optionally wherein forming the wide-bandgap semiconductor transistor comprises:

forming a nucleation layer on the substrate layer;

forming a III-nitride transition layer on the nucleation layer, forming a III-nitride buffer layer arranged on the transition layer;

forming a channel layer arranged on the buffer layer;

forming a III-nitride barrier layer on the channel region;

forming a source terminal, a gate terminal and a drain terminal on the barrier layer; and configuring the source terminal and the drain terminal such that an electric current flows between the source terminal and the drain terminal via a two-dimensional electron gas (2DEG) induced at a heterojunction interface between the channel layer and the barrier layer when the gate terminal is biased at a threshold level.

12. A method as in claim 1, wherein the drift region in the substrate layer comprises forming a superjunction structure, wherein the superjunction structure comprises alternating n doped and p doped layers.

13. A method as in claim 1, where forming the second terminal comprises: forming a Schottky contact over a second surface of the substrate layer.

14. A method of making a power device, the method comprising:

forming a substrate layer, wherein the substrate layer comprises a doped semiconductor material;

forming a drift region of a high voltage diode in the substrate layer;

forming a wide-bandgap semiconductor transistor over, and in physical contact with, a first section of a first surface of the substrate layer, wherein the first section includes at least part of the drift region of the high voltage diode;

forming a first terminal over a second section of the first surface of the substrate layer;

forming a second terminal over a third section of the first surface of the substrate layer, wherein forming the second terminal on the substrate layer comprises:

forming a recess in the wide-bandgap semiconductor transistor over the third section of the substrate;

implanting a second highly doped region of the first conductivity type in the third section of the substrate layer, and forming a contact over the second highly doped region; and forming the drift region and the first and the second terminal such that a high voltage diode is formed in the substrate layer, wherein at least part of the diode is located below at least part of the wide-bandgap semiconductor transistor.

15. A method as in claim 14, wherein:

the first conductivity type is p-type;

the first terminal is a cathode terminal of the diode; and the second terminal is an anode terminal of the diode.

16. A method as in claim 14, wherein:

the first conductivity type is n-type;

the first terminal is an anode terminal of the diode; and the second terminal is a cathode terminal of the diode.

17. A method of making a power device, the method comprising:

forming a substrate layer, wherein the substrate layer comprises a doped semiconductor material;

forming a drift region of a high voltage diode in the substrate layer;

forming a wide-bandgap semiconductor transistor over, and in physical contact with, a first section of a first surface of the substrate layer, wherein the first section includes at least part of the drift region of the high voltage diode;

forming a first terminal over a second section of the first surface of the substrate layer;

forming a second terminal over either:

a second surface of the substrate layer, wherein the second surface is opposite the first surface; or a third section of the first surface of the substrate layer;

wherein the method comprises forming the drift region and the first and the second terminal such that a high voltage diode is formed in the substrate layer, wherein at least part of the diode is located below at least part of the wide-bandgap semiconductor transistor; and wherein:

the wide-bandgap semiconductor transistor is a gallium nitride high electron mobility transistor (GaN HEMT); and the doped semiconductor material is silicon carbide.

18. The method of claim 17, wherein forming the wide-bandgap semiconductor transistor comprises:

forming a nucleation layer on the substrate layer;

forming a channel layer arranged on the nucleation layer;

forming a III-nitride barrier layer on the channel region;

forming a source terminal, a gate terminal and a drain terminal on the barrier layer; and configuring the source terminal and the drain terminal such that an electric current flows between the source terminal and the drain terminal via a two-dimensional electron gas (2DEG) induced at a heterojunction interface between the channel layer and the barrier layer when the gate terminal is biased at a threshold level.

* * * * *